(12) United States Patent
Choi et al.

(10) Patent No.: US 12,402,470 B2
(45) Date of Patent: Aug. 26, 2025

(54) DISPLAY APPARATUS HAVING DISPLAY AREA SURROUNDING PORTION OF OPENING AREA

(71) Applicant: Samsung Display Co., Ltd., Yongin-si (KR)

(72) Inventors: Jungmin Choi, Yongin-si (KR); Sangyeol Kim, Yongin-si (KR); Jehyun Song, Yongin-si (KR); Woosik Jeon, Yongin-si (KR); Eonseok Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 606 days.

(21) Appl. No.: 17/674,803

(22) Filed: Feb. 17, 2022

(65) Prior Publication Data
US 2022/0271255 A1 Aug. 25, 2022

(30) Foreign Application Priority Data
Feb. 23, 2021 (KR) .......................... 10-2021-0024227

(51) Int. Cl.
*H10K 50/15* (2023.01)
*H10K 50/16* (2023.01)
(Continued)

(52) U.S. Cl.
CPC ............. *H10K 50/15* (2023.02); *H10K 50/84* (2023.02); *H10K 59/1213* (2023.02);
(Continued)

(58) Field of Classification Search
CPC .. H10K 50/84; H10K 59/1213; H10K 59/124; H10K 59/131; H10K 71/00;
(Continued)

(56) References Cited

U.S. PATENT DOCUMENTS 8,471,275 B2  6/2013 Lee et al.
10,541,380 B1 * 1/2020 Sung ..................... H10K 59/122
(Continued)

FOREIGN PATENT DOCUMENTS

KR  10-2011-0087829 A  8/2011
KR  10-2019-0121690 A  10/2019
(Continued)

*Primary Examiner* — Herve-Louis Y Assouman
(74) *Attorney, Agent, or Firm* — Womble Bond Dickinson (US) LLP

(57) ABSTRACT

A display apparatus includes: a substrate including an opening area, a display area surrounding at least a portion of the opening area, and an intermediate area between the opening area and the display area; and a display element at the display area, and including a pixel electrode, an opposite electrode on the pixel electrode, and an intermediate layer between the pixel electrode and the opposite electrode. The intermediate layer includes a first common layer, a second common layer on the first common layer, and an emission layer between the first common layer and the second common layer, the first common layer and the second common layer extend to the intermediate area, and the second common layer is directly on the first common layer at the intermediate area.

14 Claims, 19 Drawing Sheets

(51) Int. Cl.
   *H10K 50/84* (2023.01)
   *H10K 59/121* (2023.01)
   *H10K 59/122* (2023.01)
   *H10K 59/123* (2023.01)
   *H10K 59/124* (2023.01)
   *H10K 59/131* (2023.01)
   *H10K 59/40* (2023.01)
   *H10K 59/65* (2023.01)
   *H10K 59/80* (2023.01)
   *H10K 59/88* (2023.01)
   *H10K 71/00* (2023.01)
   *H10K 71/16* (2023.01)
   *H10K 77/10* (2023.01)

(52) U.S. Cl.
   CPC ......... *H10K 59/124* (2023.02); *H10K 59/131* (2023.02); *H10K 59/65* (2023.02); *H10K 59/8731* (2023.02); *H10K 71/00* (2023.02)

(58) Field of Classification Search
   CPC .. H10K 59/8731; H10K 71/166; H10K 50/16; H10K 50/15; H10K 59/65; H10K 59/40; H10K 59/122; H10K 59/123; H10K 59/88; H10K 59/121; H10K 77/111; H04M 1/0266
   See application file for complete search history.

(56) References Cited

U.S. PATENT DOCUMENTS

| | | |
|---|---|---|
| 10,840,317 B2 | 11/2020 | Oh et al. |
| 11,322,570 B2 | 5/2022 | Lee |
| 2016/0164036 A1 | 6/2016 | Jung et al. |
| 2019/0198811 A1 | 6/2019 | Choi et al. |
| 2019/0319212 A1 | 10/2019 | Park et al. |
| 2019/0334120 A1 | 10/2019 | Seo et al. |
| 2020/0013834 A1 | 1/2020 | Park et al. |
| 2020/0119304 A1 | 4/2020 | Choi et al. |
| 2020/0127231 A1 | 4/2020 | Yun et al. |
| 2020/0127233 A1 | 4/2020 | Sung et al. |
| 2020/0212159 A1* | 7/2020 | Lee ..................... H10K 59/131 |
| 2020/0365674 A1 | 11/2020 | Jeon et al. |
| 2020/0403047 A1 | 12/2020 | Oh et al. |
| 2020/0403180 A1 | 12/2020 | Seon et al. |
| 2022/0020957 A1 | 1/2022 | Choi |

FOREIGN PATENT DOCUMENTS

| | | |
|---|---|---|
| KR | 10-2019-0126016 A | 11/2019 |
| KR | 10-2020-0044442 A | 4/2020 |
| KR | 10-2020-0082492 A | 7/2020 |
| KR | 10-2020-0102580 A | 9/2020 |
| KR | 10-2020-0131397 A | 11/2020 |
| KR | 10-2020-0144627 A | 12/2020 |
| WO | 2020/166793 A1 | 8/2020 |

* cited by examiner

DISPLAY APPARATUS HAVING DISPLAY AREA SURROUNDING PORTION OF OPENING AREA

CROSS-REFERENCE TO RELATED APPLICATION

This application claims priority to and the benefit of Korean Patent Application No. 10-2021-0024227, filed on Feb. 23, 2021, in the Korean Intellectual Property Office, the entire content of which is hereby incorporated by reference.

BACKGROUND

1. Field

Aspects of one or more embodiments relate to a display apparatus and a method of manufacturing the same, and more particularly, to a display apparatus having improved reliability and a method of manufacturing the same.

2. Description of the Related Art

Recently, the usage of display apparatuses has diversified. In addition, as display apparatuses have become thinner and lighter, their range of use has gradually been extended.

As the area occupied by a display area in the display apparatuses expands, various functions that are combined or associated with the display apparatuses have been added. In order to add various functions while expanding the display area, research is being carried out on display apparatuses in which various elements may be arranged in the display area.

The above information disclosed in this Background section is for enhancement of understanding of the background of the present disclosure, and therefore, it may contain information that does not constitute prior art.

SUMMARY

One or more embodiments are directed to a display apparatus having an improved reliability while including an area in which various suitable kinds of components may be arranged inside a display area, and a manufacturing method thereof. However, the aspects and features of the present disclosure are not limited thereto.

Additional aspects and features will be set forth, in part, in the description that follows, and in part, will be apparent from the detailed description, or may be learned by practicing one or more of the presented embodiments of the present disclosure.

According to one or more embodiments, a display apparatus includes: a substrate including an opening area, a display area surrounding at least a portion of the opening area, and an intermediate area between the opening area and the display area; and a display element at the display area, and including a pixel electrode, an opposite electrode on the pixel electrode, and an intermediate layer between the pixel electrode and the opposite electrode. The intermediate layer includes a first common layer, a second common layer on the first common layer, and an emission layer between the first common layer and the second common layer, the first common layer and the second common layer extend to the intermediate area, and the second common layer is directly on the first common layer at the intermediate area.

In an embodiment, the first common layer and the second common layer may each have an opening at the intermediate area.

In an embodiment, the display apparatus may further include: a thin-film encapsulation layer on the display element, and including at least one inorganic encapsulation layer and at least one organic encapsulation layer; and an inorganic insulating layer at the display area and the intermediate area, and located between the substrate and a first partition wall. The inorganic insulating layer may contact the inorganic encapsulation layer through the opening.

In an embodiment, the display apparatus may further include: a first partition wall at the intermediate area, and surrounding the opening area, and the opening may include a first opening between the first partition wall and the display area.

In an embodiment, the opening may further include a second opening between the first partition wall and the opening area.

In an embodiment, the display apparatus may further include: a second partition wall spaced from the first partition wall, and the opening may further include a third opening between the first partition wall and the second partition wall.

In an embodiment, the display apparatus may further include: a thin-film transistor at the display area; and an organic insulating layer on the thin-film transistor, and the opposite electrode may cover a lateral end portion of the organic insulating layer.

In an embodiment, the intermediate area may include a laser irradiation region, and the opposite electrode may not be located at the laser irradiation region.

In an embodiment, the display apparatus may further include: a capping layer on the opposite electrode, and the capping layer may not be located at the laser irradiation region.

In an embodiment, the display apparatus may further include: a wiring portion at a region of the display area that is adjacent to the intermediate area, the wiring portion bypassing the opening area; and a dummy emission layer on the wiring portion.

In an embodiment, the dummy emission layer may include a same material as that of the emission layer.

In an embodiment, the dummy emission layer may be between the first common layer and the second common layer.

In an embodiment, the dummy emission layer may include the same material as that of the emission layer.

In an embodiment, a thickness of the first common layer may be greater than a thickness of the second common layer.

According to one or more embodiments, a display apparatus includes: a substrate including an opening area, a display area surrounding at least a portion of the opening area, and an intermediate area between the opening area and the display area; a pixel electrode at the display area; an emission layer at the display area; an opposite electrode on the emission layer, and located at the display area and the intermediate area; a common organic material layer between the pixel electrode and the opposite electrode, and located at the display area and the intermediate area; and an inorganic encapsulation layer on the opposite electrode, and located at the display area and the intermediate area. The common organic material layer has an opening surrounding the opening area at the intermediate area, and the inorganic encapsulation layer directly contacts an inorganic layer exposed through the opening.

According to one or more embodiments, a method of manufacturing a display apparatus includes: providing a substrate including a first area, a display area surrounding at least a portion of the first area, and an intermediate area between the first area and the display area; forming a sacrificial metal layer at the intermediate area; forming a first common layer on an entire surface of the substrate to cover the sacrificial metal layer; forming a plurality of emission layer patterns on the first common layer at the display area; forming a second common layer on the entire surface of the substrate to cover the plurality of emission layer patterns; forming an opposite electrode on the entire surface of the substrate to cover the second common layer; removing the sacrificial metal layer, and portions of the first common layer and the second common layer on the sacrificial metal layer, by irradiating a laser to the substrate at the intermediate area; and forming a through hole at the first area, by irradiating a laser to the first area of the substrate.

In an embodiment, the removing of the portions of the first common layer and the second common layer may include removing the sacrificial metal layer by irradiating the laser, thereby removing the portions of the first common layer and the second common layer formed on the sacrificial metal layer.

In an embodiment, an opening may be formed in the first common layer by removing the sacrificial metal layer and the portion of the first common layer on the sacrificial metal layer.

In an embodiment, the method may further include forming an inorganic encapsulation layer on the opposite electrode, and the inorganic encapsulation layer may directly contact an inorganic layer exposed through the opening of the first common layer.

In an embodiment, the method may further include removing a portion of the opposite electrode by irradiating the laser to the substrate at the intermediate area.

In an embodiment, the portion of the opposite electrode may be removed concurrently with the removing of the sacrificial metal layer.

In an embodiment, the plurality of emission layer patterns may not be formed at the intermediate area during the forming of the plurality of emission layer patterns.

In an embodiment, the plurality of emission layer patterns may be formed by using a fine metal mask, and the fine metal mask may not include an opening in a portion thereof corresponding to the intermediate area.

These and/or other aspects and features of the present disclosure will become apparent and more readily appreciated from the following description of the presented embodiments, the accompanying drawings, and the claims and their equivalents.

These general and specific embodiments may be implemented by using a system, a method, a computer program, or a combination of a system, a method, and a computer program.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
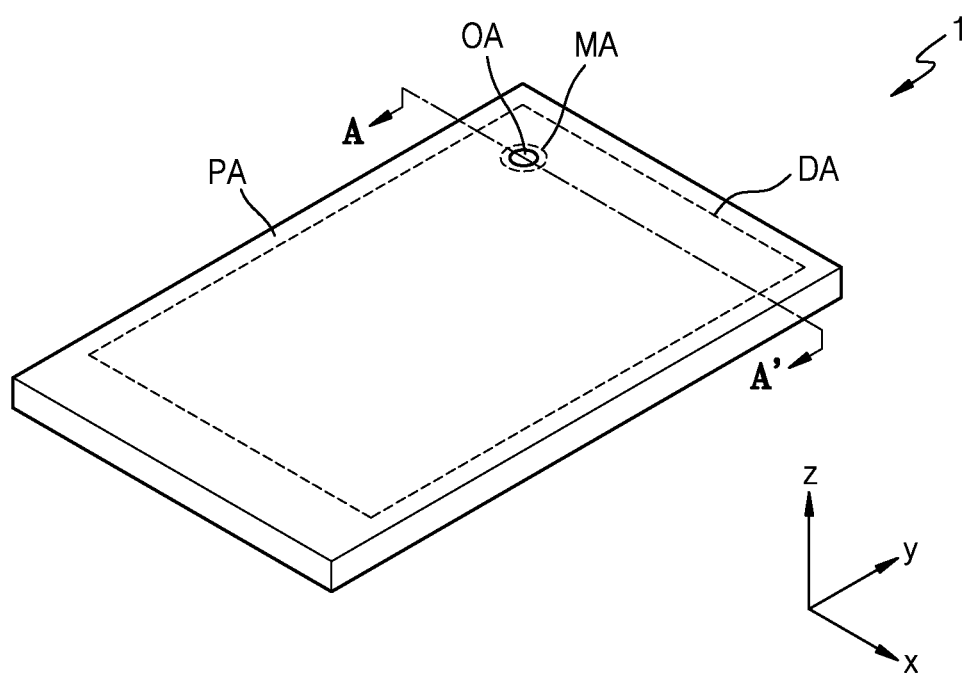
FIG. 1 is a perspective view of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus 1 according to an embodiment.

Referring to FIG. 1, the display apparatus 1 includes an opening area OA (e.g., a transmission area or a first area), and a display area DA surrounding (e.g., around a periphery of) at least a portion of the opening area OA. The display apparatus 1 may display an image (e.g., a preset or predetermined image) by using light emitted from a plurality of pixels arranged at (e.g., in or on) the display area DA. The opening area OA may be partially or entirely surrounded (e.g., around a periphery thereof) by the display area DA. The opening area OA may be an area in which a component is arranged, which will be described in more detail below with reference to FIG. 2.

An intermediate area MA is arranged between the opening area OA and the display area DA. The display area DA may be surrounded (e.g., around a periphery thereof) by a peripheral area PA. The intermediate area MA and the peripheral area PA may be a kind of non-display area at (e.g., in or on) which pixels are not arranged. The intermediate area MA may be partially or entirely surrounded (e.g., around a periphery thereof) by the display area DA. The display area DA may be entirely surrounded (e.g., around a periphery thereof) by the peripheral area PA.

Hereinafter, an organic light-emitting display apparatus is described in more detail as an example of the display apparatus 1 according to an embodiment, but the present disclosure is not limited thereto. In another embodiment, the display apparatus 1 may be a quantum-dot light-emitting display. As an example, an emission layer of a display element of the display apparatus 1 may include an organic material, an inorganic material, quantum dots, an organic material and quantum dots, or an inorganic material and quantum dots.

FIG. 1 shows one opening area OA having a circular shape, but the present disclosure is not limited thereto. In other embodiments, the number of opening areas OA may be two or more, and each of the opening areas OA may have various suitable shapes, for example, such as a circular shape, an elliptical shape, a polygonal shape, a diamond shape, a bar shape, or the like.

In addition, while FIG. 1 shows that the display apparatus 1 includes the display area DA having a plane surface, the present disclosure is not limited thereto, and at least a portion of the display apparatus 1 may be foldable, bendable, and/or rollable. In this case, at least a portion of the display area DA may have a curved surface.

Figure 2:
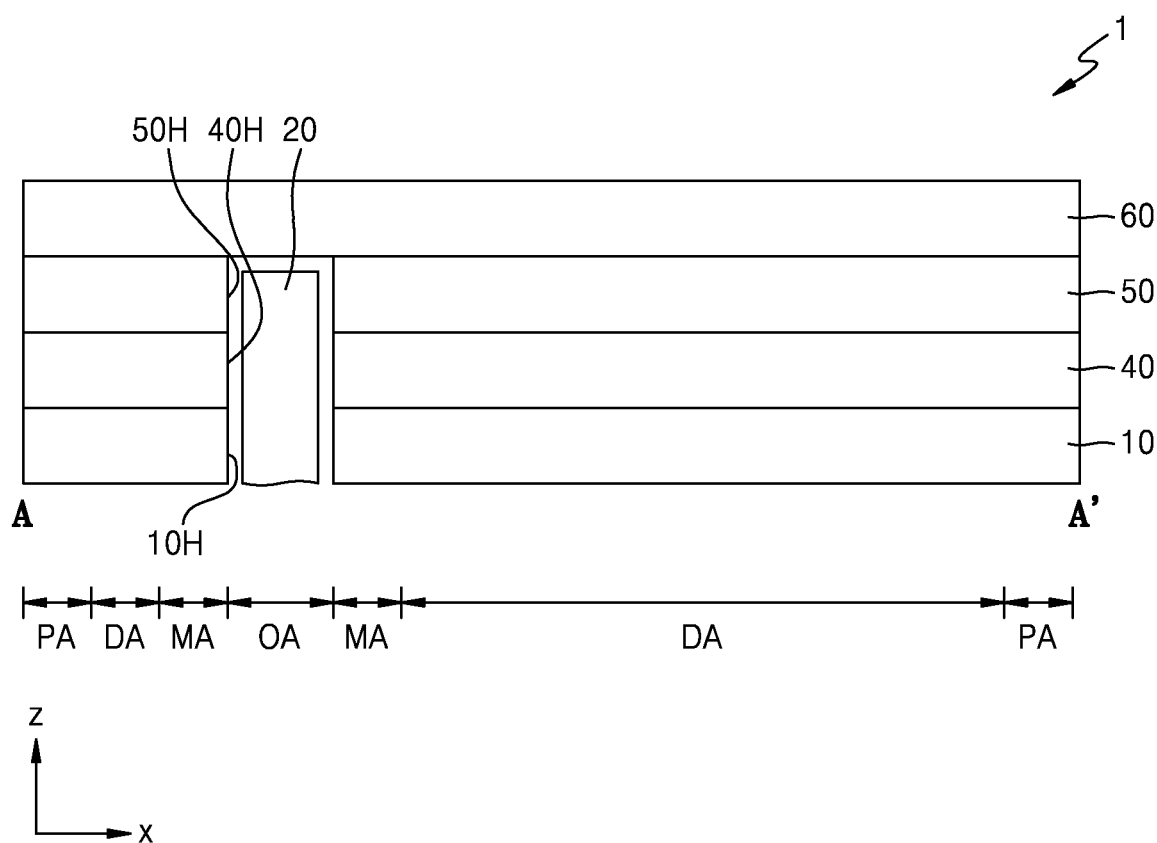
FIG. 2 is a cross-sectional view of a display apparatus according to an embodiment.

FIG. 2 is a cross-sectional view of the display apparatus 1 according to an embodiment, and may correspond to a cross-section of the display apparatus 1 taken along the line A-A' of FIG. 1.

Referring to FIG. 2, the display apparatus 1 may include a display panel 10. An input sensing layer 40 and an optical functional layer 50 may be on the display panel 10. The display panel 10, the input sensing layer 40, and the optical functional layer 50 may be covered by a window 60. The display apparatus 1 may include (or may be included in) various suitable kinds of electronic apparatuses, for example, such as mobile phones, notebook computers, smartwatches, and the like.

The display panel 10 may display an image. The display panel 10 includes pixels arranged at (e.g., in or on) the display area DA. The pixels may include a display element, and a pixel circuit connected to the display element. The display element may include an organic light-emitting diode or a quantum-dot organic light-emitting diode, but the present disclosure is not limited thereto.

The input sensing layer 40 obtains coordinate information corresponding to an external input, for example, such as a touch event. The input sensing layer 40 may include a sensing electrode (e.g., a touch electrode), and trace lines connected to the sensing electrode. The input sensing layer 40 may be arranged on the display panel 10. The input sensing layer 40 may sense an external input through a mutual capacitive method and/or a self-capacitive method.

The input sensing layer 40 may be directly formed on the display panel 10, or may be separately formed and then connected to (e.g., coupled to or attached to) the display panel 10 through an adhesive layer, for example, such as an optical clear adhesive. As an example, the input sensing layer 40 may be successively formed on the display panel 10 after a process of forming the display panel 10. In this case, the input sensing layer 40 may be understood as being a portion of the display panel 10, and an adhesive layer may not be arranged between the input sensing layer 40 and the display panel 10. While FIG. 2 shows that the input sensing layer 40 is arranged between the display panel 10 and the optical functional layer 50, in another embodiment, the input sensing layer 40 may be arranged on the optical functional layer 50.

The optical functional layer 50 may include an anti-reflection layer. The anti-reflection layer may reduce a reflectivity of light (e.g., external light) incident toward the display panel 10 from the outside through the window 60. The anti-reflection layer may include a retarder and a polarizer. In another embodiment, the anti-reflection layer may include a black matrix and color filters. In addition, the optical functional layer 50 may include a lens layer. The lens layer may improve a light-emission efficiency of the light emitted from the display panel 10, or may reduce a color deviation. The optical functional layer 50 may include all of the above-described anti-reflection layer and the lens layer, or may include any suitable one of the anti-reflection layer or the lens layer.

In an embodiment, the optical functional layer 50 may be successively formed after a process of forming the display panel 10 and/or the input sensing layer 40. In this case, an adhesive layer may not be arranged between the optical functional layer 50 and the display panel 10, and/or between the optical functional layer 50 and the input sensing layer 40.

The display panel 10, the input sensing layer 40, and/or the optical functional layer 50 may include an opening. For example, as shown in FIG. 2, the display panel 10, the input sensing layer 40, and the optical functional layer 50 may include first to third openings 10H, 40H, and 50H, respectively, and the first to third openings 10H, 40H, and 50H may overlap with one another. The first to third openings 10H, 40H, and 50H are arranged to correspond to the opening area OA.

In another embodiment, at least one of the display panel 10, the input sensing layer 40, or the optical functional layer 50 may not include an opening. As an example, one or two from among the display panel 10, the input sensing layer 40, and the optical functional layer 50 may not include an opening.

The opening area OA may be a kind of component area (e.g., a sensor area, a camera area, a speaker area, and/or the like) in which a component 20 for adding various suitable functions to the display apparatus 1 is arranged as described above. For example, the component 20 may be arranged inside (e.g., within) the first to third openings 10H, 40H, and 50H as shown in FIG. 2. As another example, the component 20 may be arranged below (e.g., underneath) the display panel 10.

The component 20 may include an electronic element. As an example, the component 20 may be an electronic element that uses light or sound. As an example, the electronic element may include a sensor, for example, such as an infrared sensor that emits and/or receives light, a camera that receives light to capture an image, a sensor that outputs and senses light or sound to measure a distance or recognize a fingerprint, a small lamp that outputs light, a speaker that outputs sound, and/or the like. An electronic element that uses light may use light in various suitable wavelength bands, for example, such as visible light, infrared light, and/or ultraviolet light. In an embodiment, the opening area OA may be understood as a transmission area through which light and/or sound that is output from the component 20 to the outside or that progresses toward the component 20 from the outside may pass.

In another embodiment, in the case where the display apparatus 1 is used as (e.g., included in) a smartwatch or an instrument panel for an automobile, the component 20 may be a member, for example, such as clock hands or a needle indicating suitable information (e.g., predetermined information), for example, such as the time of day, the velocity of a vehicle, or the like. In the case where the display apparatus 1 includes clock hands or an instrument panel for an automobile, the component 20 may pass through the window 60, and may be exposed to the outside. In this case, the window 60 may also include an opening that corresponds to the opening area OA.

The component 20 may include an element(s) related to the function of the display panel 10 as described above, or may include an element or the like, for example, such as an accessory that increases an aesthetic sense of the display panel 10.

Figure 3:
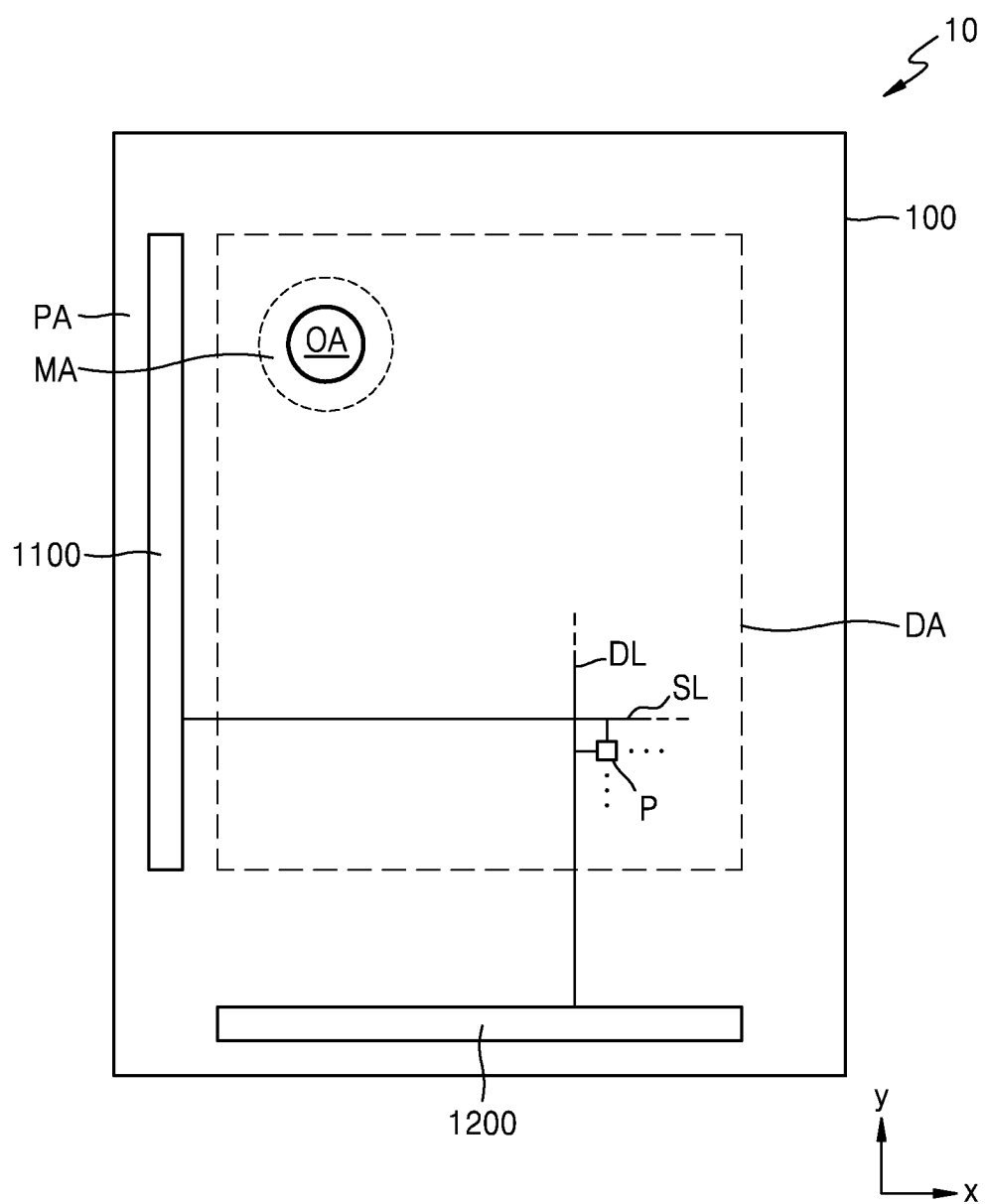
FIG. 3 is a plan view of a display panel according to an embodiment.
Figure 4:
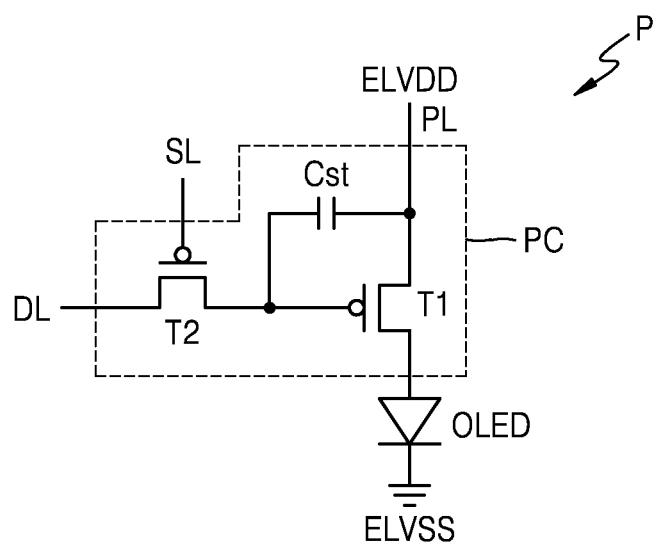
FIG. 4 is an equivalent circuit diagram of a pixel of a display panel according to an embodiment.

FIG. 3 is a plan view of the display panel 10 according to an embodiment, and FIG. 4 is an equivalent circuit diagram of a pixel of the display panel 10 according to an embodiment.

Referring to FIG. 3, the display panel 10 may include the opening area OA, the display area DA, the intermediate area MA, and the peripheral area PA. For convenience of description, it may be understood that a substrate 100 of the display panel 10 includes the opening area OA, the display area DA, the intermediate area MA, and the peripheral area PA.

The display panel 10 includes a plurality of pixels P arranged at (e.g., in or on) the display area DA. As shown in FIG. 4, each pixel P may include a pixel circuit PC, and an organic light-emitting diode OLED as a display element connected to the pixel circuit PC. The pixel circuit PC may include a first thin film transistor T1, a second thin film transistor T2, and a storage capacitor Cst. Each pixel P may emit, for example, a suitable one of red, green, blue, or white light from the organic light-emitting diode OLED.

The second thin-film transistor T2 may be a switching thin-film transistor connected to a scan line SL and a data line DL, and may be configured to transfer a data voltage input from the data line DL to the first thin-film transistor T1 according to (e.g., based on) a switching voltage input from the scan line SL. The storage capacitor Cst may be connected to the second thin-film transistor T2 and a driving voltage line PL, and may be configured to store a voltage corresponding to a difference between a voltage transferred from the second thin-film transistor T2 and a first power voltage ELVDD supplied to the driving voltage line PL.

The first thin-film transistor T1 may be connected to the driving voltage line PL and the storage capacitor Cst, and may be configured to control a driving current flowing from the driving voltage line PL to the organic light-emitting diode OLED according to the voltage stored in the storage capacitor Cst. The organic light-emitting diode OLED may emit light having a desired brightness (e.g., a preset or predetermined brightness) based on the driving current. An opposite electrode (e.g., a cathode) of the organic light-emitting diode OLED may receive a second power voltage ELVSS.

While FIG. 4 shows that the pixel circuit PC includes two thin-film transistors and one storage capacitor, the present disclosure is not limited thereto. The number of thin-film transistors and the number of storage capacitors may be variously modified depending on the design of the pixel circuit PC. As an example, the pixel circuit PC may include four or more thin-film transistors in addition to the two thin-film transistors. In an embodiment, the pixel circuit PC may include seven thin-film transistors and one storage capacitor.

Referring again to FIG. 3, the intermediate area MA may surround (e.g., around a periphery of) the opening area OA in a plan view (e.g., a view from a direction that is perpendicular to or substantially perpendicular to a surface (e.g., a top surface) of the relevant element, member, or layer (e.g., the display panel 10)). The intermediate area MA is an area at (e.g., in or on) which a display element, for example, such as an organic light-emitting diode that emits light, is not arranged. Signal lines may pass across (or extend around) the intermediate area MA, the signal lines being configured to provide a signal to the pixels P arranged around (e.g., adjacent to) the opening area OA. A scan driver 1100, a data driver 1200, and main power wirings may be arranged at (e.g., in or on) the peripheral area PA. The scan driver 1100 may be configured to provide a scan signal to each of the pixels P, the data driver 1200 may be configured to provide a data signal to each of the pixels P, and the main power wiring may be configured to provide the first power voltage ELVDD and the second power voltage ELVSS. While FIG. 3 shows that the data driver 1200 is arranged adjacent to one lateral side of the substrate 100, the present disclosure is not limited thereto, and in another embodiment, the data driver 1200 may be arranged on a flexible printed circuit board (FPCB) that is electrically connected to a pad arranged on a side (e.g., on one side) of the display panel 10.

Figure 5:
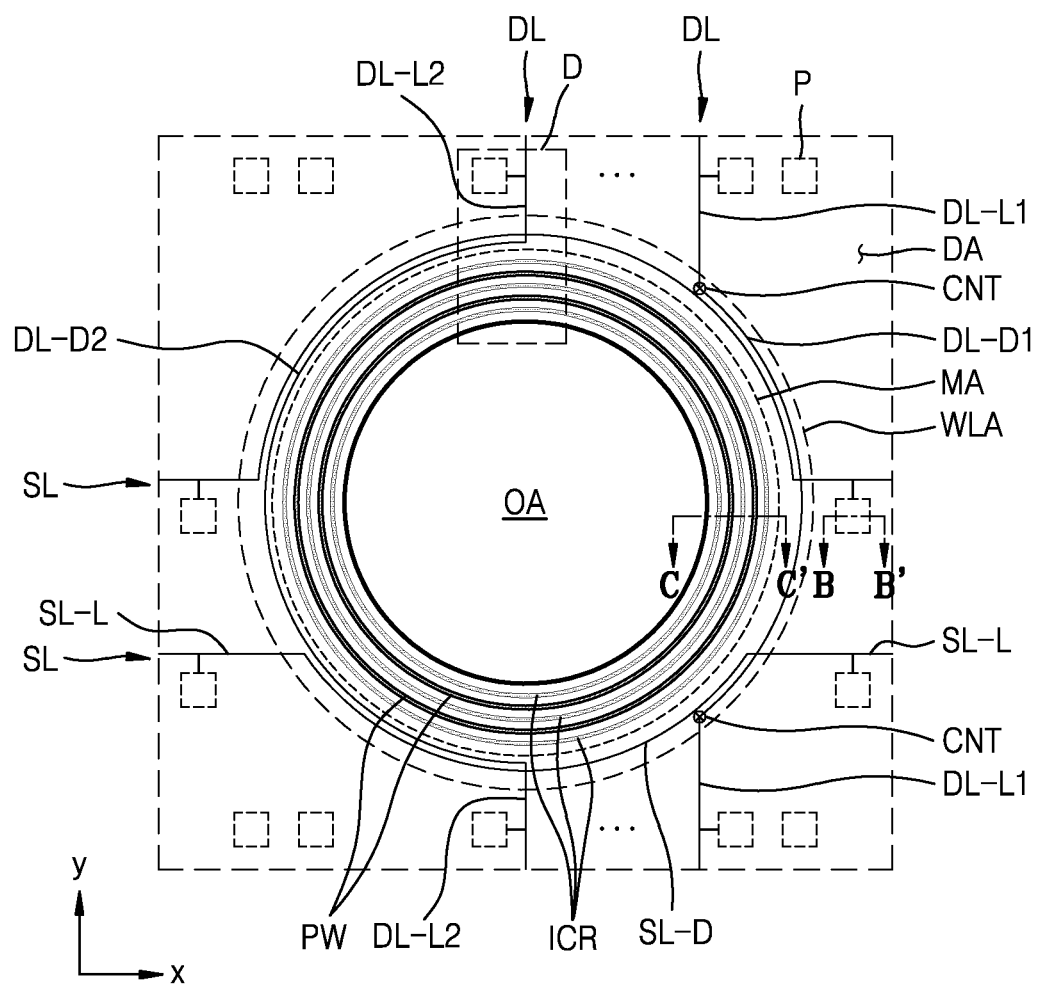
FIG. 5 is an enlarged plan view of a portion of a display panel according to an embodiment.
Figure 6:
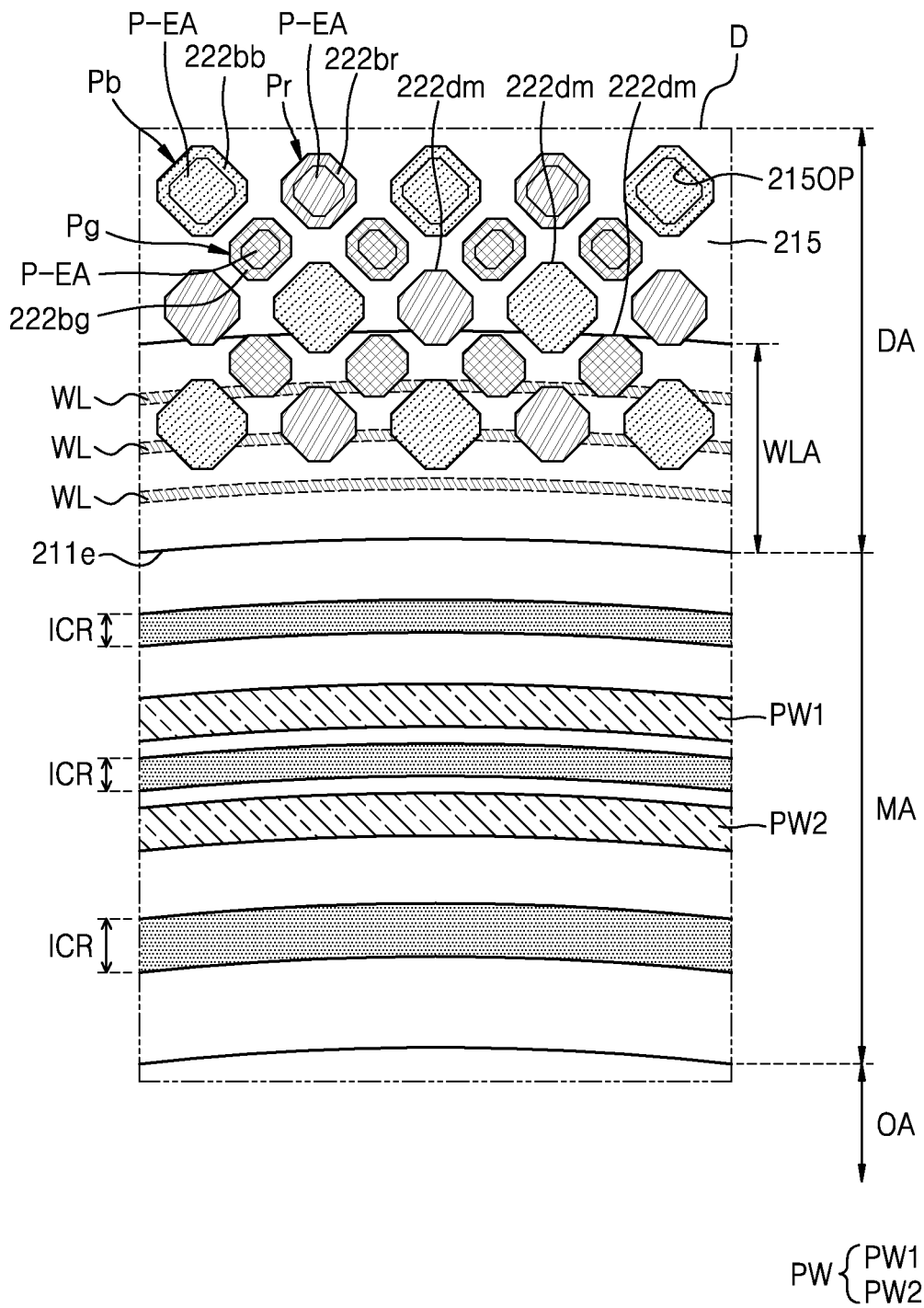
FIG. 6 is an enlarged plan view of the region D of FIG. 5.
Figure 7:
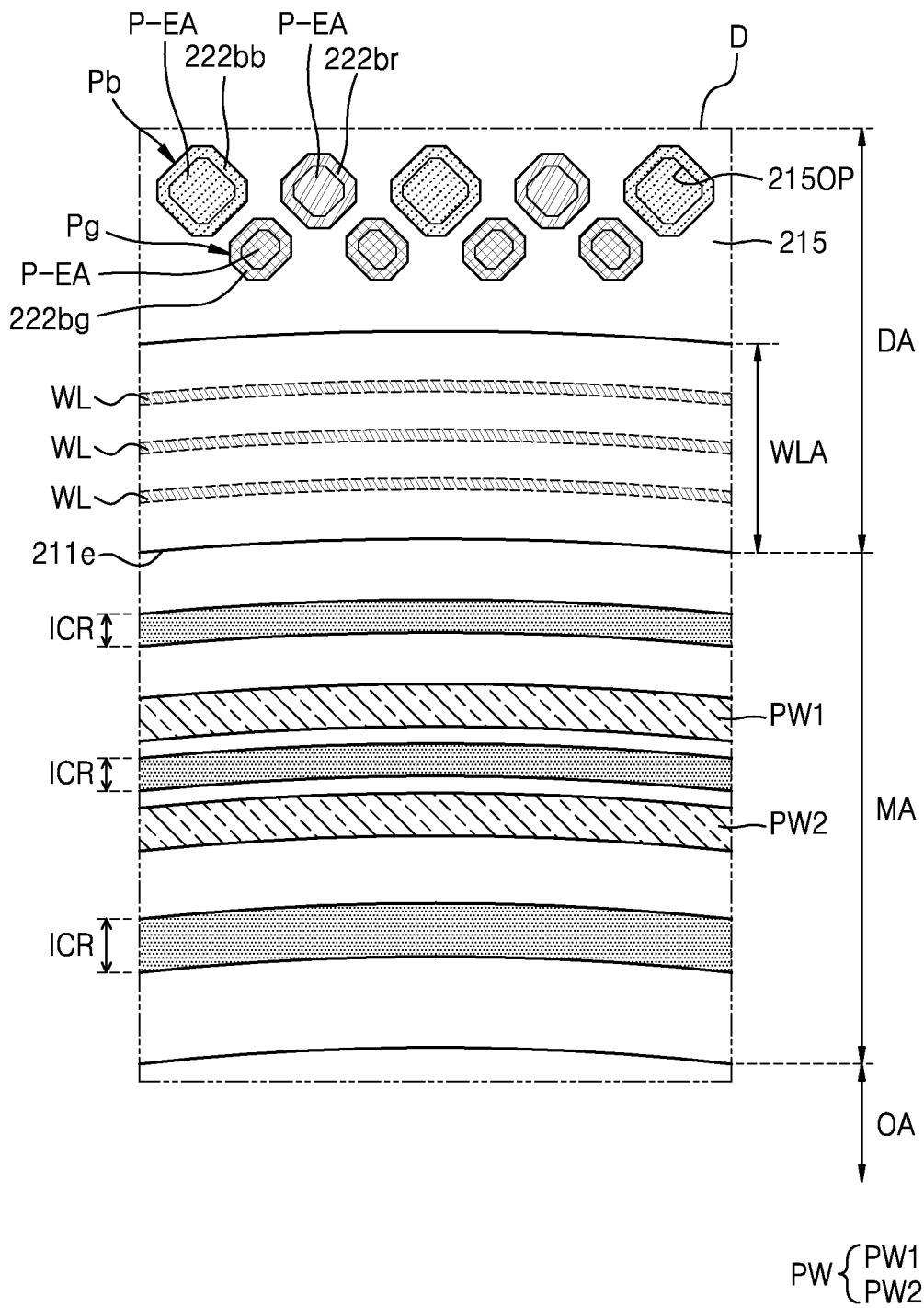
FIG. 7 is an enlarged plan view of the region D of FIG. 5.

FIG. 5 is an enlarged plan view of a portion of the display panel 10 according to an embodiment, and FIGS. 6 and 7 are enlarged plan views of the region D of FIG. 5.

Referring to FIG. 5, the intermediate area MA may be arranged between the opening area OA and the display area DA. Unlike the display area DA, pixels P may not be arranged at (e.g., in or on) the intermediate area MA. In a plan view, the intermediate area MA may surround (e.g., around a periphery of) the opening area OA.

The pixels P are arranged at (e.g., in or on) the display area DA with the opening area OA between some of the pixels P. Some pixels P may be spaced apart from each other with the opening area OA therebetween, and the opening area OA may be defined between some of the pixels P. As an example, in a plan view, some of the pixels P may be vertically arranged around (e.g., adjacent to) the opening area OA, and some of the pixels P may be horizontally arranged around (e.g., adjacent to) the opening area OA.

Signal lines that are adjacent to the opening area OA from among the signal lines configured to supply a signal to the pixels P may detour around (e.g., may extend around a periphery of) the opening area OA. In this case, the signal lines that detour around the opening area OA may be arranged along an edge of the display area DA that is adjacent to the intermediate area MA. Hereinafter, an area in which the signal lines that detour around the opening area OA are arranged is defined as a wiring area WLA. The wiring area WLA may refer to an edge area of the display area DA that is adjacent to the intermediate area MA.

As shown in FIG. 5, in a plan view, one of the data lines DL passing across (e.g., extending across) the display area DA may extend in a y-direction to provide a data signal to the pixels P vertically arranged around the opening area OA, and may detour around the opening area OA and the intermediate area MA along the edge of the display area DA. In a plan view, one of the scan lines SL passing across (e.g., extending across) the display area DA may extend in an x-direction to provide a scan signal to the pixels P horizontally arranged around the opening area OA, and may detour around the opening area OA and the intermediate area MA along the edge of the display area DA.

A circuitous portion or a bypass portion SL-D of the scan line SL may be arranged at (e.g., in or on) the same layer as that of an extension portion SL-L that passes across (e.g., that extends across) the display area DA, and these portions may be formed as one body. A bypass portion DL-D1 of at least one of the data lines DL may be formed at (e.g., in or on) a layer different from that of an extension portion DL-L1 of the at least one data line DL that passes across (e.g., that extends across) the display area DA, and may be connected to the extension portion DL-L1 through a contact hole CNT. A bypass portion DL-D2 of at least one other of the data lines DL may be arranged at (e.g., in or on) the same layer as that of an extension portion DL-L2 of the at least one other data line DL, and these portions may be formed as one body.

Referring to FIGS. 5 and 6, at least one partition wall PW may be arranged at (e.g., in or on) the intermediate area MA. In a plan view, each partition wall PW has a closed curve shape, for example, such as a ring shape that surrounds (e.g., around a periphery of) the opening area OA. In the case where the partition wall PW is provided in a plurality of partition walls PW1 and PW2, the partition walls PW1 and PW2 may be spaced apart from each other. As shown in FIGS. 5 and 6, two partition walls PW1 and PW2 may be arranged at (e.g., in or on) the intermediate area MA. The partition walls PW1 and PW2 arranged at (e.g., in or on) the intermediate area MA may prevent or substantially prevent an organic encapsulation layer 320 (e.g., see FIG. 8) from overflowing to the opening area OA.

The intermediate area MA is an area configured to prevent or substantially prevent foreign substances and/or moisture that may be introduced from the opening area OA to the display area, and may include an inorganic contact region ICR at (e.g., in or on) at least a portion thereof. In the inorganic contact region ICR, because a lower inorganic layer contacts an upper inorganic layer with the organic light-emitting diode OLED therebetween, an organic layer is not arranged between the lower inorganic layer and the upper inorganic layer. Thus, foreign substances and/or moisture that may be introduced or transmitted through the organic layer may be prevented or substantially prevented. In an embodiment, the lower inorganic layer may include at least one of a buffer layer 201, a gate insulating layer 203, a first interlayer insulating layer 205, and/or a second interlayer insulating layer 207, and the upper inorganic layer may include a first inorganic encapsulation layer 310 of a thin-film encapsulation layer 300.

Referring to FIG. 6, pixels Pr, Pg, and Pb may be arranged at (e.g., in or on) the display area DA. The pixels Pr, Pg, and Pb may include emission layers 222br, 222bg, and 222bb, respectively. Each of the emission layers 222br, 222bg, and 222bb may include an emission area P-EA that emits or substantially emits light in a region defined through a corresponding opening 215OP of a pixel-defining layer 215.

Dummy emission layers 222dm may be arranged at (e.g., in or on) the wiring area WLA that is arranged along the edge of the display area DA. The dummy emission layers 222dm include the same materials as those of the emission layers 222br, 222bg, and 222bb arranged at (e.g., in or on) the display area DA, but may not emit or substantially emit light. Because a pixel electrode and a pixel circuit are not arranged below the dummy emission layers 222dm, the dummy emission layers 222dm may not serve or substantially serve as pixels. The dummy emission layers 222dm may be concurrently (e.g., simultaneously) formed during a process of forming the emission layers 222br, 222bg, and 222bb. A portion of the dummy emission layers 222dm may overlap with wirings WL (e.g., the signal lines) that detour around the intermediate area MA at (e.g., in or on) an outer portion thereof.

However, the present disclosure is not limited thereto, and the dummy emission layers 222dm shown in FIG. 6 may be omitted. For example, as shown in FIG. 7, in another embodiment, the dummy emission layers 222dm may not be provided.

As described above, the dummy emission layers 222dm may not be arranged or may be arranged at (e.g., in or on) the wiring area WLA as needed or desired (e.g., depending on the design or manufacturing process of the display panel 10). In both cases, the dummy emission layers 222dm may not be arranged at (e.g., in or on) the intermediate area MA.

Figure 8:
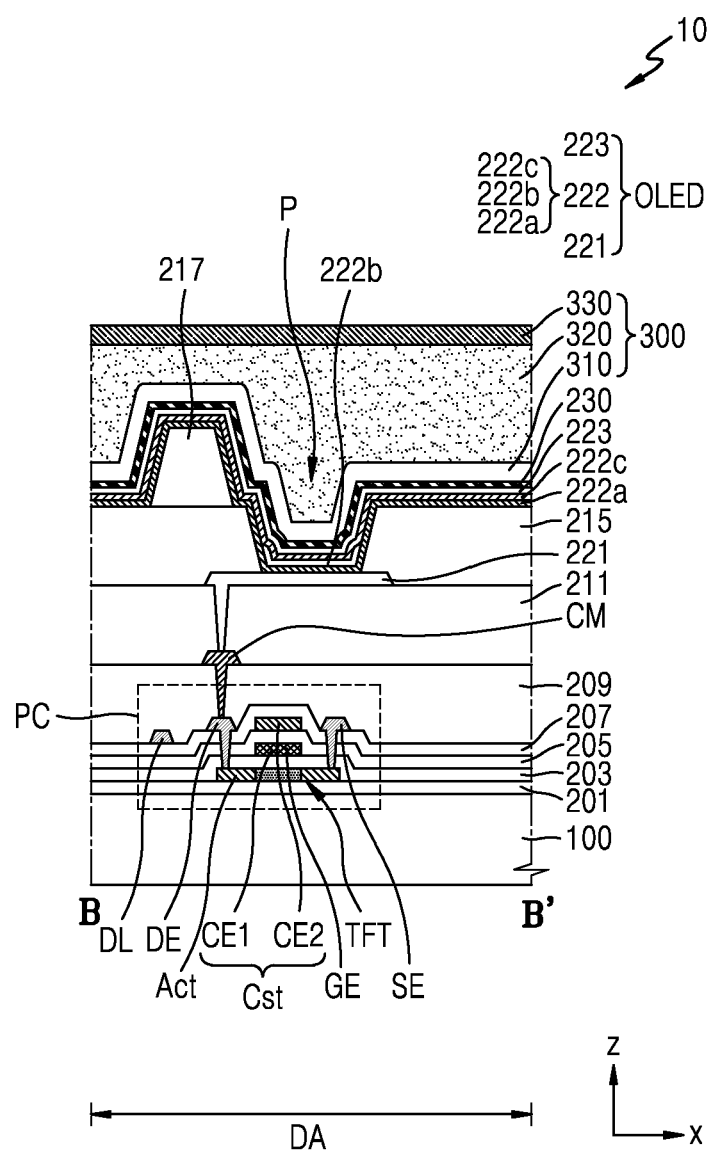
FIG. 8 is a cross-sectional view of a portion of a display area of a display apparatus according to an embodiment.
Figure 9:
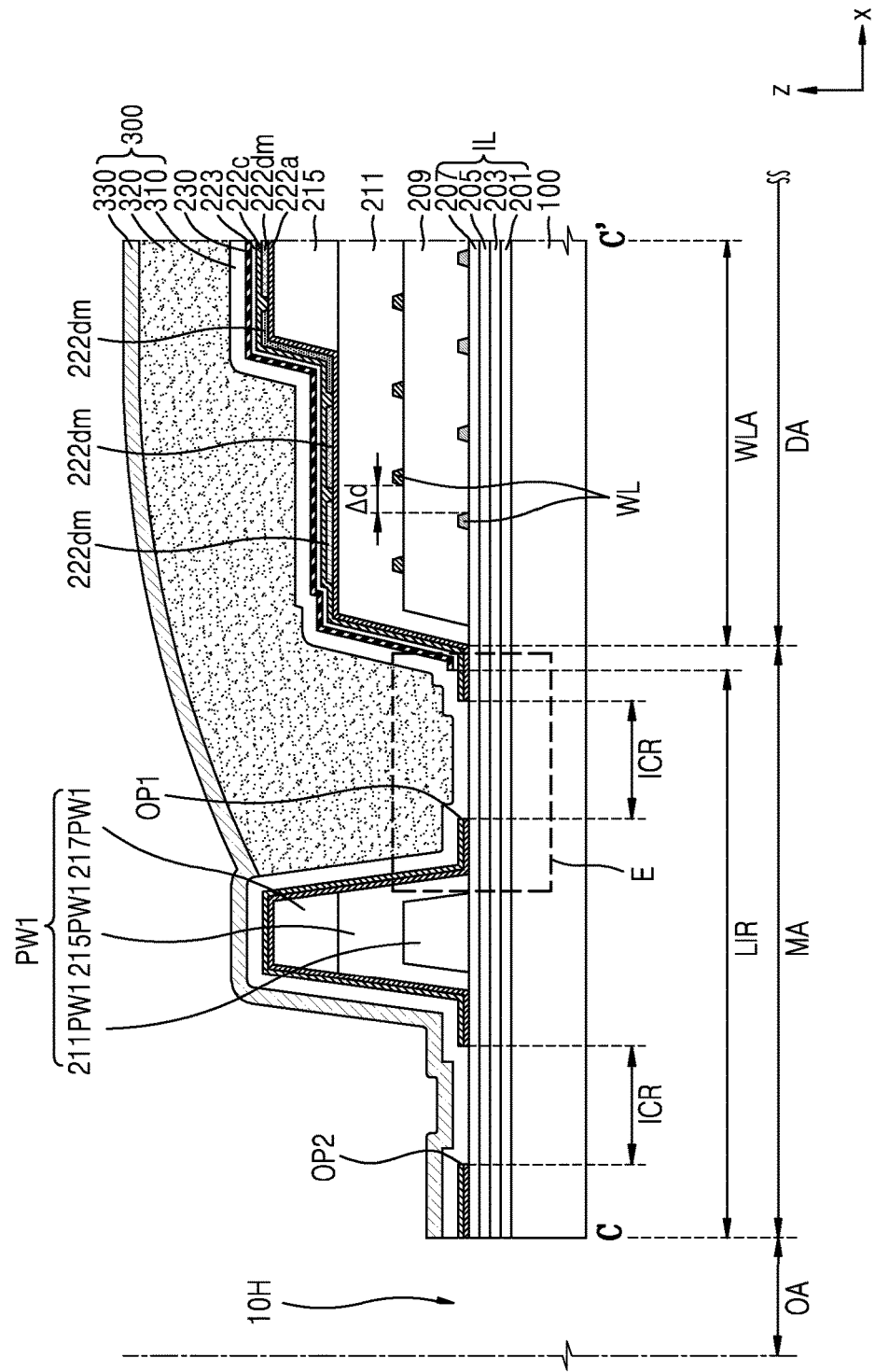
FIG. 9 is a cross-sectional view of a portion of a display area and an intermediate area of a display apparatus according to an embodiment.
Figure 10A:
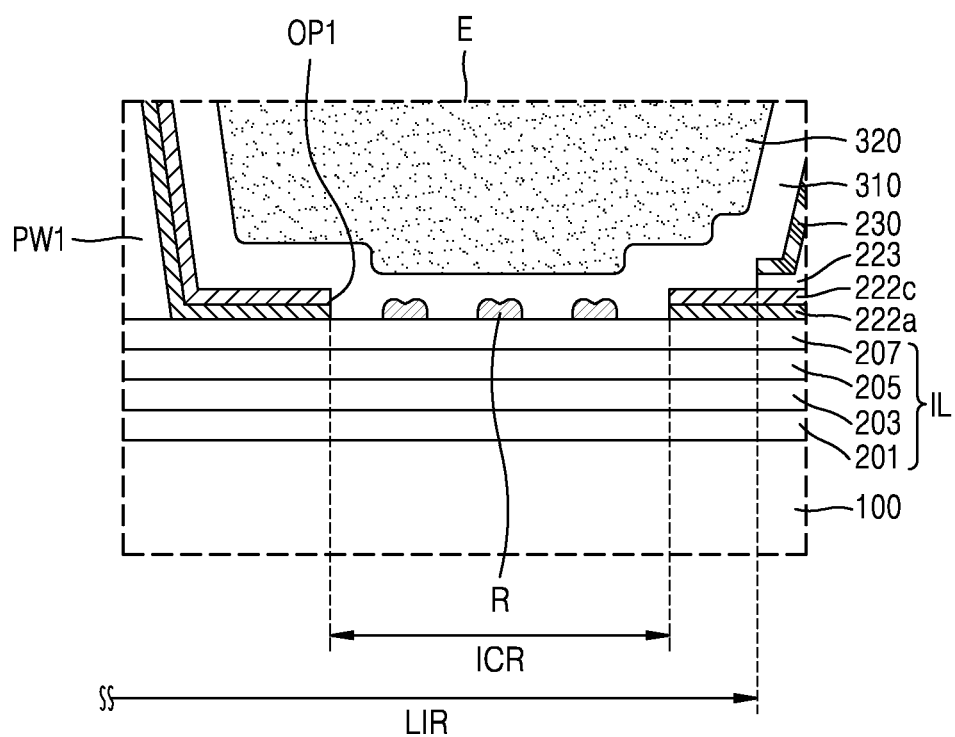
FIGS. 10A-10B are enlarged cross-sectional views of the region E of FIG. 9.
Figure 10B:
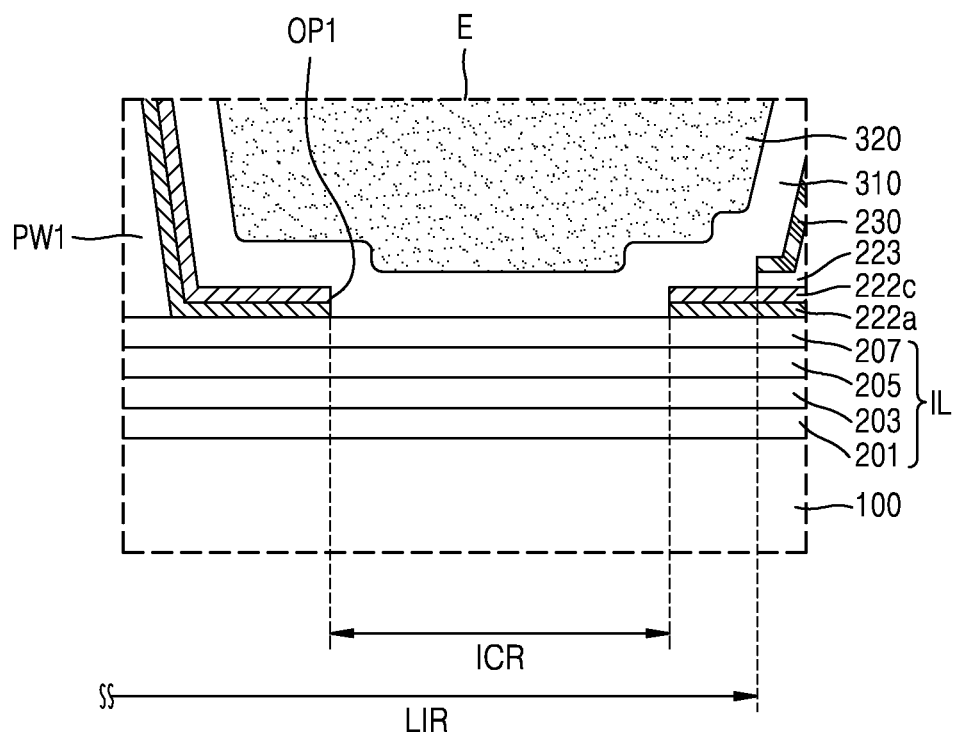

FIG. 8 is a cross-sectional view of a portion of the display area DA of the display apparatus 1 according to an embodiment. FIG. 9 is a cross-sectional view of a portion of the display area DA and the intermediate area MA of the display apparatus 1 according to an embodiment. FIGS. 10A and 10B are enlarged cross-sectional views of the region E of FIG. 9.

First, a cross-sectional structure of the display area DA is described in more detail with reference to the display panel 10 of FIG. 8. FIG. 8 may correspond to a cross-section of the display area DA taken along the line B-B' of FIG. 5.

The substrate 100 may include glass or a polymer resin. In an embodiment, the substrate 100 may include a plurality of layers. As an example, the substrate 100 may have a structure in which at least one organic layer and at least one inorganic layer are alternately arranged (e.g., are alternately stacked on one another).

The buffer layer 201 may be formed on the substrate 100. The buffer layer 201 may prevent or substantially prevent impurities from penetrating into a semiconductor layer Act of a thin-film transistor TFT. The buffer layer 201 may include an inorganic insulating material, for example, such as silicon nitride, silicon oxynitride, and/or silicon oxide. The buffer layer 201 may include a single layer or multi-layers.

The pixel circuit PC may be arranged on the buffer layer 201. The pixel circuit PC includes the thin-film transistor TFT and the storage capacitor Cst. The thin-film transistor TFT may include the semiconductor layer Act, a gate electrode GE, a source electrode SE, and a drain electrode DE. The thin-film transistor TFT shown in FIG. 8 may be the first thin-film transistor T1 described above with reference to FIG. 4, and may correspond to a driving thin-film transistor. The data line DL of the pixel circuit PC is electrically connected to a switching thin-film transistor (e.g., the second thin-film transistor T2 of FIG. 4) of the pixel circuit PC, which is not shown in FIG. 8. While FIG. 8 shows an embodiment of a top-gate type thin-film transistor TFT in which the gate electrode GE is arranged above the semiconductor layer Act with the gate insulating layer 203 therebetween, the present disclosure is not limited thereto, and in another embodiment, the thin-film transistor TFT may be a bottom gate type thin-film transistor.

The semiconductor layer Act may include polycrystalline silicon. In other examples, the semiconductor layer Act may include amorphous silicon, an oxide semiconductor, or an organic semiconductor.

The gate electrode GE may include a low-resistance metal material. The gate electrode GE may include a conductive material including molybdenum (Mo), aluminum (Al), copper (Cu), and/or titanium (Ti), and may include a single layer or multi-layers.

The gate insulating layer 203 between the semiconductor layer Act and the gate electrode GE may include an inorganic insulating material including silicon oxide, silicon nitride, silicon oxynitride, aluminum oxide, titanium oxide, tantalum oxide, and/or hafnium oxide. The gate insulating layer 203 may include a single layer or multi-layers including one or more of the above materials.

The source electrode SE and the drain electrode DE, which are connection electrodes that are electrically connected to the semiconductor layer Act, may be arranged at (e.g., in or on) the same layer as that of the data line DL, and may include the same material as that of the data line DL. The source electrode SE, the drain electrode DE, and the data line DL may include a material having excellent conductivity. The source electrode SE and the drain electrode DE may include a conductive material including molybdenum (Mo), aluminum (Al), copper (Cu), and/or titanium (Ti), and may include a single layer or multi-layers. In an embodiment, the source electrode SE, the drain electrode DE, and the data line DL may include a multi-layered structure of Ti/Al/Ti.

The storage capacitor Cst may include a bottom electrode CE1 and a top electrode CE2 overlapping with each other with the first interlayer insulating layer 205 therebetween. The storage capacitor Cst may overlap with the thin-film transistor TFT. For example, as shown in FIG. 8, the gate electrode GE of the thin-film transistor TFT may be (or may serve as) the bottom electrode CE1 of the storage capacitor Cst. In another embodiment, the storage capacitor Cst may not overlap with the thin-film transistor TFT. The storage capacitor Cst may be covered by the second interlayer insulating layer 207. The top electrode CE2 of the storage capacitor Cst may include a conductive material including molybdenum (Mo), aluminum (Al), copper (Cu), and/or titanium (Ti), and may include a single layer or multi-layers including one or more of the above materials.

The first interlayer insulating layer 205 and the second interlayer insulating layer 207 may include an inorganic insulating material including silicon oxide, silicon nitride, silicon oxynitride, aluminum oxide, titanium oxide, tantalum oxide, and/or hafnium oxide. The first interlayer insulating layer 205 and the second interlayer insulating layer 207 may each include a single layer or multi-layers including one or more of the above materials.

A first organic insulating layer 209 and a second organic insulating layer 211 may be arranged on the second interlayer insulating layer 207. The first organic insulating layer 209 and the second organic insulating layer 211 may include a flat or substantially flat (e.g., an approximately flat) upper surface.

The pixel circuit PC may be electrically connected to a pixel electrode 221. As an example, as shown in FIG. 8, a contact metal layer CM may be arranged between the pixel circuit PC and the pixel electrode 221. The contact metal layer CM may be connected to the pixel circuit PC through a contact hole defined in the first organic insulating layer 209, and the pixel electrode 221 may be connected to the contact metal layer CM through a contact hole defined in the second organic insulating layer 211 that is on the contact metal layer CM. The contact metal layer CM may include a conductive material including molybdenum (Mo), aluminum (Al), copper (Cu), and/or titanium (Ti), and may include a single layer or multi-layers including one or more of the above materials. In an embodiment, the contact metal layer CM may include a multi-layered structure of Ti/Al/Ti.

The first organic insulating layer 209 and the second organic insulating layer 211 may include a general-purpose polymer, for example, such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof. In an embodiment, the first organic insulating layer 209 and the second organic insulating layer 211 may include polyimide.

The pixel electrode 221 may be formed on the second organic insulating layer 211. The pixel electrode 221 may include a conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 221 may further include a layer on and/or under the reflective layer, for example, such as a layer including ITO, IZO, ZnO, or $In_2O_3$. As an example, the pixel electrode 221 may include a multi-layered structure of ITO/Ag/ITO.

The pixel-defining layer 215 may be formed on the pixel electrode 221. The pixel-defining layer 215 may include an opening that exposes the upper surface of the pixel electrode 221, and may cover the edges of the pixel electrode 221. The pixel-defining layer 215 may include an organic insulating material. As another example, the pixel-defining layer 215 may include an inorganic insulating material, for example, such as silicon nitride ($SiN_x$), silicon oxynitride (SiON), or silicon oxide ($SiO_x$). As another example, the pixel-defining layer 215 may include an organic insulating material and an inorganic insulating material.

An intermediate layer 222 may be on the pixel electrode 221, and may include an emission layer 222b. The emission layer 222b may include a polymer or a low-molecular weight organic material that emits light having a suitable color (e.g., a preset or predetermined color). As another example, the intermediate layer 222 may include at least one organic material layer under and/or on the emission layer 222b. In an embodiment, the intermediate layer 222 may include a first common layer 222a under (e.g., underneath) the emission layer 222b and/or a second common layer 222c on the emission layer 222b.

The first common layer 222a may include a single layer or multi-layers. For example, in the case where the first common layer 222a includes a polymer material, the first common layer 222a may include a hole transport layer (HTL), which has a single-layer structure, including poly(3,4-ethylenedioxythiophene) (PEDOT) or polyaniline (PANI). In the case where the first common layer 222a includes a low molecular weight material, the first common layer 222a may include a hole injection layer (HIL) and a hole transport layer (HTL).

In the case where the first common layer 222a and the emission layer 222b include a polymer material, the second common layer 222c may be formed. The second common layer 222c may include a single layer or multi-layers. The second common layer 222c may include an electron transport layer (ETL) and/or an electron injection layer (EIL). However, the present disclosure is not limited thereto, and the second common layer 222c may be omitted depending on a structure of the intermediate layer 222.

In an embodiment, the thickness (e.g., in a z-direction) of the first common layer 222a may be thicker than the thickness of the second common layer 222c. As an example, the thickness of the first common layer 222a may be about 1100 Å to about 2200 Å, and the thickness of the second common layer 222c may be about 350 Å to about 2200 Å.

The emission layer 222b of the intermediate layer 222 may be separately arranged for each pixel at (e.g., in or on) the display area DA. In other words, the emission layer 222b may be patterned to correspond to the pixel electrode 221 of each pixel. The emission layer 222b may include an emission material layer and an auxiliary layer. The emission material layer may include a polymer organic material or a low-molecular weight organic material that emits light having a suitable color (e.g., a preset or predetermined color) The auxiliary layer may assist a resonance distance of the emission material layer. The auxiliary layer may include, for example, a hole transport material such as poly (3, 4-ethylenedioxythiophene) (PEDOT) or polyaniline (PANI). The emission material layer and the auxiliary layer may have different thicknesses from each other depending on a color of the light emitted by the corresponding pixel.

Unlike the emission layer 222b, the first common layer 222a and/or the second common layer 222c of the intermediate layer 222 may be provided at (e.g., in or on) the intermediate area MA as well as at (e.g., in or on) the display area DA.

An opposite electrode 223 may be on the intermediate layer 222, and may include a conductive material having a low work function. As an example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. As another example, the opposite electrode 223 may further include a layer on the (semi) transparent layer including one or more of the above materials, and the layer may include ITO, IZO, ZnO, or $In_2O_3$. The opposite electrode 223 may be formed at (e.g., in or on) the intermediate area MA as well as at (e.g., in or on) the display area DA. The first common layer 222a, the second common layer 222c, and the opposite electrode 223 may be formed through thermal deposition.

A capping layer 230 may be arranged on the opposite electrode 223. As an example, the capping layer 230 may include lithium fluoride (LiF), and may be formed through thermal deposition. However, the present disclosure is not limited thereto, and in an embodiment, the capping layer 230 may be omitted.

A spacer 217 may be formed on the pixel-defining layer 215. The spacer 217 may include an organic insulating material, for example, such as polyimide. As another example, the spacer 217 may include an inorganic insulating material, or may include an organic insulating material and an inorganic insulating material.

The spacer 217 may include a material that is different from that of the pixel-defining layer 215, or may include the same material as that of the pixel-defining layer 215. As an example, the pixel-defining layer 215 and the spacer 217 may be concurrently (e.g., simultaneously) formed during a mask process that uses a half-tone mask. In an embodiment, the pixel-defining layer 215 and the spacer 217 may include polyimide.

The organic light-emitting diode OLED may include the pixel electrode 221, the intermediate layer 222, and the opposite electrode 223. The organic light-emitting diode OLED may be covered by the thin-film encapsulation layer 300. The thin-film encapsulation layer 300 may include at least one organic encapsulation layer and at least one inorganic encapsulation layer. For example, FIG. 8 shows that the thin-film encapsulation layer 300 includes first and second inorganic encapsulation layers 310 and 330, and the organic encapsulation layer 320 therebetween. However, the present disclosure is not limited thereto, and in other embodiments, the number of organic encapsulation layers, the number of inorganic encapsulation layers, and a stacking order thereof may be variously modified.

The first and second inorganic encapsulation layers 310 and 330 may include at least one inorganic material from among aluminum oxide, titanium oxide, tantalum oxide, hafnium oxide, zinc oxide, silicon oxide, silicon nitride, and silicon oxynitride. The first and second inorganic encapsulation layers 310 and 330 may include a single layer or multi-layers including one or more of the above materials.

The organic encapsulation layer 320 may include a polymer-based material. The polymer-based material may include an acryl-based resin, an epoxy-based resin, polyimide, and/or polyethylene. In an embodiment, the organic encapsulation layer 320 may include acrylate.

The thicknesses (e.g., in the z-direction) of the first and second inorganic encapsulation layers 310 and 330 may be different from each other. For example, the thickness of the first inorganic encapsulation layer 310 may be greater than the thickness of the second inorganic encapsulation layer 330. As another example, the thickness of the second inorganic encapsulation layer 330 may be greater than the thickness of the first inorganic encapsulation layer 310. However, the present disclosure is not limited thereto, and the thickness of the first inorganic encapsulation layer 310 may be the same or substantially the same as the thickness of the second inorganic encapsulation layer 330.

The wiring area WLA and the intermediate area MA are described in more detail hereinafter with reference to FIG. 9.

The first organic insulating layer 209 and the second organic insulating layer 211 may also be arranged at (e.g., in or on) the wiring area WLA. In an embodiment, the wiring area WLA may denote an edge region of the display area DA that is adjacent to the intermediate area MA. In addition, in an embodiment, the display area DA may be defined as an area at (e.g., in or on) which the first organic insulating layer 209 and/or the second organic insulating layer 211, which are organic layers, are arranged as described above.

The wirings WL may be arranged at (e.g., in or on) the wiring area WLA. The wirings WL may correspond to the signal lines that are configured to supply a signal to the pixels P. The wirings WL may include (e.g., may be) the data line DL and/or the scan line SL, and may correspond to the bypass portions DL-D1, DL-D2, and SL-D of the data lines DL and the scan lines SL shown in FIG. 5.

In an embodiment, the wirings WL at (e.g., in or on) the wiring area WLA may be alternately arranged with an insulating layer therebetween. As an example, one of the wirings WL that is adjacent to another one of the wirings WL may be arranged under (e.g., underneath) the insulating layer (e.g., under the first organic insulating layer 209), and the other one of the wirings WL may be arranged on the insulating layer (e.g., on the first organic insulating layer 209). In the case where the wirings WL are alternately arranged with the insulating layer therebetween, a distance Δd (e.g., a pitch) between data lines DL may be reduced.

A portion of a multi-layered structure may extend on the insulating layers arranged at (e.g., in or on) the wiring area WLA. The multi-layered structure may include a portion of some of the layers forming the organic light-emitting diode OLED. For example, the multi-layered structure may include the first common layer 222a, the second common layer 222c, and the opposite electrode 223, as well as the capping layer 230. Furthermore, in an embodiment, the multi-layered structure may further include the dummy emission layers 222dm between the first common layer 222a and the second common layer 222c. The dummy emission layers 222dm may each include at least one of a red emission material, a green emission material, or a blue emission material. As shown in FIG. 6, the dummy emission layers 222dm may be patterned and spaced apart from each other by a suitable interval (e.g., by a preset or predetermined interval). The dummy emission layers 222dm may include the emission materials, but may not emit light or may not substantially emit light, unlike the emission layers of the organic light-emitting diodes OLED.

The dummy emission layers 222dm may have the same or substantially the same structure as that of the emission layer 222b. In other words, the dummy emission layer 222dm may include the emission material layer and the auxiliary layer, the emission material layer including a polymer organic material or a low-molecular weight organic material configured to emit light having a suitable color (e.g., a preset or predetermined color), and the auxiliary layer assisting a resonance distance of the emission material layer. The emission material layer and the auxiliary layer may have different thicknesses from each other depending on a color of light that may be emitted. Because the dummy emission layer 222dm does not emit light or does not substantially emit light, but is concurrently (e.g., simultaneously) formed during a process of forming the emission layer 222b, the dummy emission layer 222dm may have the same or substantially the same structure as that of the emission layer 222b.

According to a comparative example, the dummy emission layers are also arranged at (e.g., in or on) the intermediate area. In this case, during a process of removing the multi-layered structure (e.g., the first common layer, the emission layer, the second common layer, the opposite electrode, and the capping layer) arranged at (e.g., in or on) the intermediate area, process foreign substances may be excessively generated due to the dummy emission layers. On the other hand, in an embodiment, because the dummy emission layers 222dm are not arranged at (e.g., in or on) the intermediate area MA during a manufacturing process, the generation of process foreign substances may be reduced while the multi-layered structure is removed.

As described above, because the dummy emission layer 222dm is not arranged at (e.g., in or on) the intermediate area MA, the second common layer 222c may be arranged directly on the first common layer 222a at (e.g., in or on) the intermediate area MA. In other words, another layer may not be arranged between the first common layer 222a and the second common layer 222c at (e.g., in or on) the intermediate area MA. The first common layer 222a may directly contact the second common layer 222c at (e.g., in or on) an entirety of (e.g., an entire surface of) the intermediate area MA.

In an embodiment, a portion of the first common layer 222a and/or the second common layer 222c arranged at (e.g., in or on) the intermediate area MA at (e.g., in or on) which the dummy emission layer 222dm is not arranged may be provided to have a thickness (e.g., in the z-direction) that is thicker than that of the first common layer 222a and/or the second common layer 222c arranged at (e.g., in or on) the display area DA. In other words, the first common layer 222a and/or the second common layer 222c may be arranged such that the thickness thereof corresponding to the display area DA is different from the thickness thereof corresponding to the intermediate area MA. This may be for reducing a thickness variation with respect to the display area DA at (e.g., in or on) which the dummy emission layer 222dm and/or the emission layer 222b are arranged.

The intermediate area MA is a region between the display area DA and the opening area OA, and may include at least one partition wall (e.g., a first partition wall PW1) and at least one inorganic contact region ICR. The intermediate area MA may prevent or substantially prevent foreign substances and/or moisture from penetrating to the display area DA through the opening area OA.

The first partition wall PW1 may be arranged at (e.g., in or on) the intermediate area MA. The first partition wall PW1 may be arranged on the inorganic insulating layer IL extending to the intermediate area MA. In another embodiment, a sub-partition wall may be further arranged on the second organic insulating layer 211 of the wiring area WLA. The first partition wall PW1 may prevent or substantially prevent the organic encapsulation layer 320 of the thin-film encapsulation layer 300 from overflowing to the opening area OA.

In an embodiment, the first partition wall PW1 may include first to third layers 211PW1, 215PW1, and 217PW1. The first layer 211PW1 of the first partition wall PW1 may include the same material as that of the first organic insulating layer 209 or the second organic insulating layer 211. The second layer 215PW1 may include the same material as that of the pixel-defining layer 215. The third layer 217PW1 may include the same material as that of the spacer 217.

The first common layer 222a and the second common layer 222c may be arranged on the first partition wall PW1. The first common layer 222a and the second common layer 222c may extend to the opening area OA, and may cover the upper surface and the lateral surfaces of the first partition wall PW1. The first and second inorganic encapsulation layers 310 and 330 may be arranged on the second common layer 222c on the first partition wall PW1.

At least one inorganic contact region ICR may be arranged at (e.g., in or on) the intermediate area MA. The inorganic contact region ICR may be provided in a closed curve shape along a shape of the opening area OA as shown in FIG. 5. The inorganic contact region ICR may be a region in which only the inorganic insulating layer IL is arranged between the first inorganic encapsulation layer 310 and the substrate 100. In other words, the inorganic insulating layer IL is arranged on the substrate 100 to correspond to the inorganic contact region ICR, and the first inorganic encapsulation layer 310 may directly contact the inorganic insulating layer IL.

In an embodiment, the first common layer 222a and the second common layer 222c may have at least one opening corresponding to the inorganic contact region ICR. In other words, the inorganic contact region ICR may be defined as the opening. It is shown in FIG. 9 that the first common layer 222a and the second common layer 222c include a first opening OP1 and a second opening OP2, respectively, each corresponding to one of the inorganic contact regions ICR. The first opening OP1 may be arranged between the first partition wall PW1 and the display area DA, and the second opening OP2 may be arranged between the first partition wall PW1 and the opening area OA.

A portion of the inorganic insulating layer IL at (e.g., in or on) the intermediate area MA may be exposed through the first opening OP1 and the second opening OP2. Because the upper surfaces of the inorganic insulating layer IL that are exposed through the first opening OP1 and the second opening OP2 contact the first inorganic encapsulation layer 310, the first opening OP1 and the second opening OP2 may constitute a plurality of inorganic contact regions ICR. Because the inorganic contact regions ICR are provided in a plurality as shown in FIG. 9, the inorganic contact regions ICR may gradually block moisture transmission from the opening area OA to the display area DA.

FIGS. 10A and 10B are enlarged cross-sectional views of the region E of FIG. 9, or in other words, the inorganic contact region ICR at the first opening OP1. Referring to FIG. 10A, a residual material layer R may remain on the inorganic insulating layer IL exposed through the first opening OP1. The residual material layer R may be a remnant that is not completely removed while the first opening OP1 is formed. The first opening OP1 (and the second opening OP2) may be formed by removing a portion of the first and second common layers 222a and 222c, which may include forming a sacrificial metal layer (e.g., see FIG. 15A) under (e.g., underneath) the first common layer 222a and removing the sacrificial metal layer, where a portion of the first and second common layers 222a and 222c on the sacrificial metal layer are concurrently (e.g., simultaneously) removed. Accordingly, a remnant that is left after the sacrificial metal layer is removed during the manufacturing process may remain as the residual material layer R inside the inorganic contact region ICR.

However, the present disclosure is not limited thereto, and in another embodiment, the residual material layer R may not remain, and may be completely removed from the inorganic contact region ICR as shown in FIG. 10B.

The intermediate area MA may include a laser irradiation region LIR. The laser irradiation region LIR may be a region to which a laser is irradiated to remove a portion or all of the multi-layered structure, or in other words, the first common layer 222a, the second common layer 222c, the opposite electrode 223, and the capping layer 230 arranged at (e.g., in or on) the intermediate area MA during the manufacturing process. The laser irradiation region LIR may be the same or substantially the same as or less than the intermediate area MA. The inorganic contact region ICR may be arranged inside the laser irradiation region LIR. The opposite electrode 223 and the capping layer 230 extending to the intermediate area MA may be removed from the laser irradiation region LIR. In other words, the opposite electrode 223 and the capping layer 230 may not be arranged at (e.g., in or on) the laser irradiation region LIR.

As described above, because the opposite electrode 223 and the capping layer 230 are removed from the laser irradiation region LIR arranged at (e.g., in or on) the intermediate area MA, and the first common layer 222a and the second common layer 222c, which are organic material layers, are removed from the inorganic contact region ICR, foreign substances and/or moisture that may be introduced to the display area DA through the opening area OA may be effectively blocked.

In addition, as described above, the dummy emission layer 222dm is not arranged at (e.g., in or on) the intermediate area MA, or in other words, the laser irradiation region LIR. As a comparative example, during a process of removing the opposite electrode and the capping layer by irradiating a laser to the laser irradiation region LIR, the dummy emission layer may be arranged in the relevant region. In this case, because laser energy is absorbed in the dummy emission layer before the laser energy is transferred to the opposite electrode, evaporation of the dummy emission layer occurs. Due to the expansion of the dummy emission layer, the opposite electrode may be broken down or torn down before the opposite electrode is removed, which becomes a cause for increasing foreign substances due to the laser process in the laser irradiation region, or in other words, the intermediate area. In the case where the process foreign substances that occurs in this manner remains in the inorganic contact region, cracks or peeling due to the foreign substances may occur to the inorganic layer, and thus, the inorganic layer may be vulnerable to moisture transmission.

In contrast, in the display apparatus according to one or more embodiments, because the dummy emission layer 222dm is not arranged at (e.g., in or on) the intermediate area MA, or in other words, the laser irradiation region LIR, foreign substance generation in the relevant region may be suppressed or reduced during the laser process.

Figure 11:
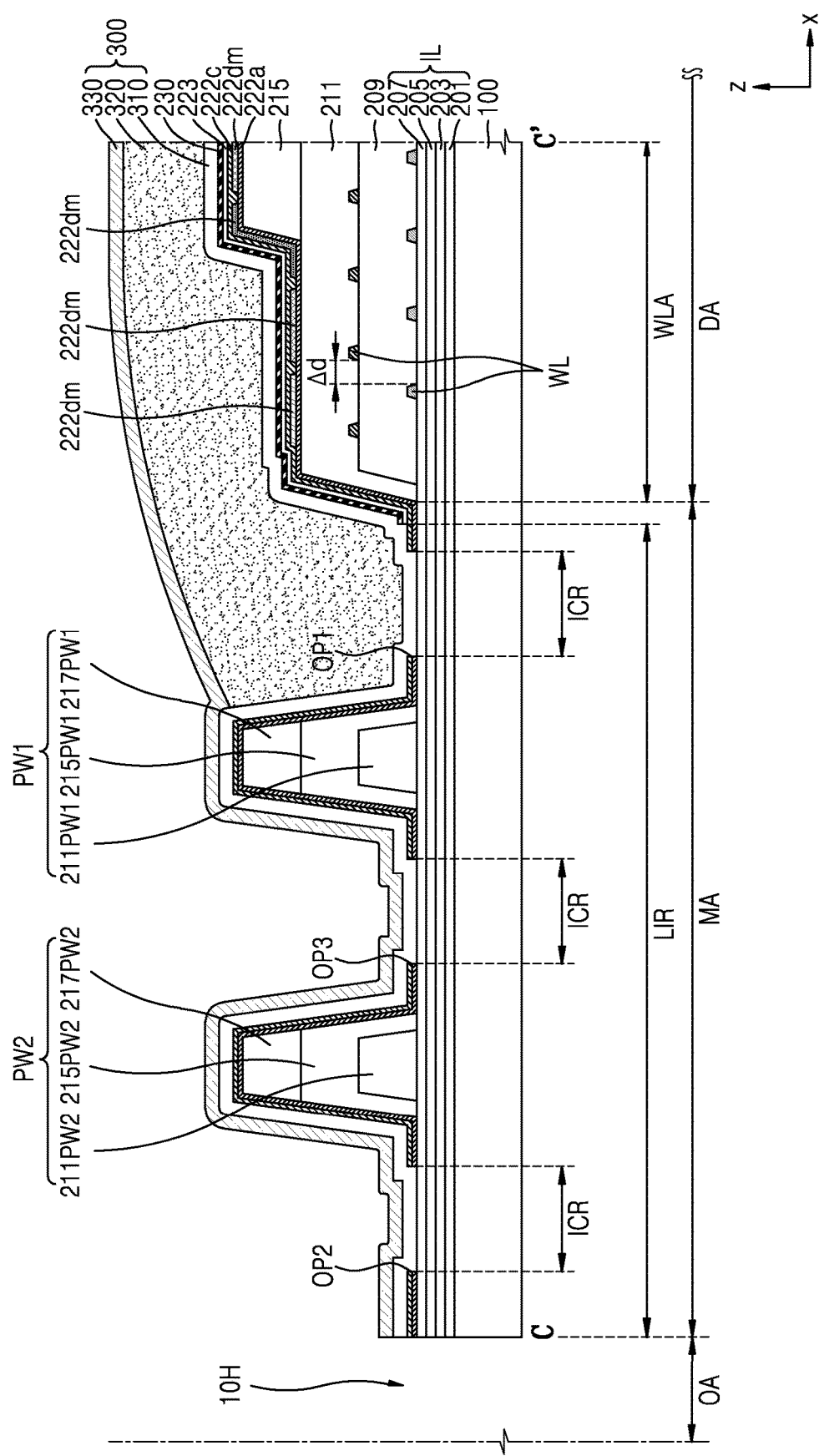
FIG. 11 is a cross-sectional view of a portion of a display panel according to an embodiment.
Figure 12:
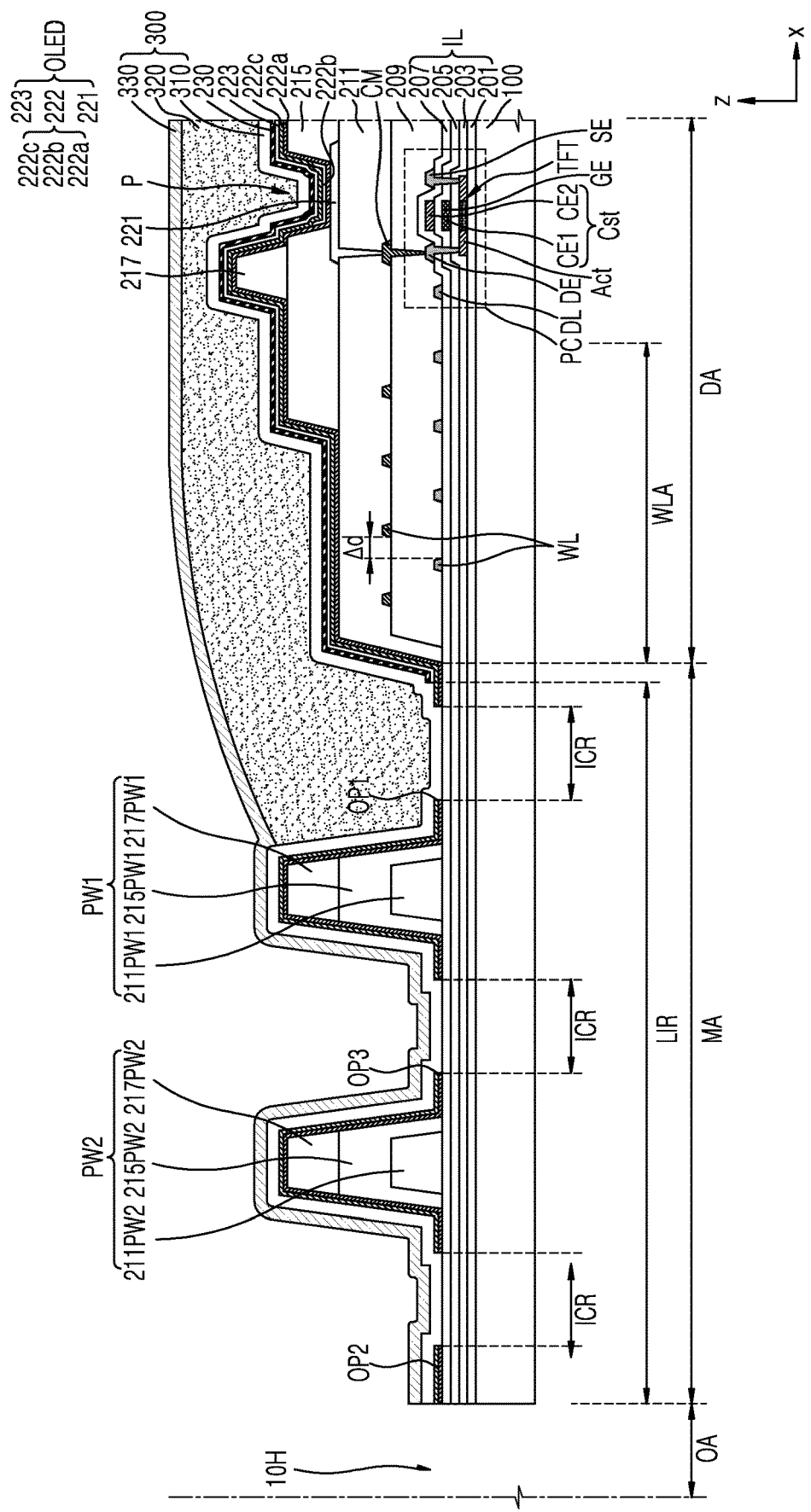
FIG. 12 is a cross-sectional view of a portion of a display panel according to an embodiment.

FIGS. 11 and 12 are cross-sectional views of a portion of a display panel according to one or more embodiments. FIGS. 11 and 12 show modified example embodiments of the embodiment of FIG. 9.

A cross-sectional structure of FIG. 11 may correspond to FIG. 6. FIG. 11 may be different from FIG. 9, in that a plurality of partition walls including the first partition wall PW1 and the second partition wall PW2 are arranged at (e.g., in or on) the intermediate area MA. Hereinafter, differences between the embodiments of FIG. 11 and FIG. 9 may be mainly described, and redundant description may not be repeated.

Referring to FIG. 11, the first partition wall PW1 and the second partition wall PW2 may be arranged at (e.g., in or on) the intermediate area MA. The first partition wall PW1 is spaced apart from the second partition wall PW2 by a suitable interval (e.g., a preset or predetermined interval). The first partition wall PW1 and the second partition wall PW2 may be arranged on the inorganic insulating layer IL extending to the intermediate area MA. The first partition wall PW1 and the second partition wall PW2 may prevent or substantially prevent the organic encapsulation layer 320 of the thin-film encapsulation layer 300 from overflowing to the opening area OA.

In an embodiment, the first partition wall PW1 may include the first to third layers 211PW1, 215PW1, and 217PW1. In addition, similar to the first partition wall PW1, the second partition wall PW2 may include first to third layers 211PW2, 215PW2, and 217PW2. The first layers 211PW1 and 211PW2 of the first partition wall PW1 and the second partition wall PW2 may include the same material as that of the first organic insulating layer 209 or the second organic insulating layer 211. The second layers 215PW1 and 215PW2 may include the same material as that of the pixel-defining layer 215. The third layers 217PW1 and 217PW2 may include the same material as that of the spacer 217.

The first common layer 222a and the second common layer 222c may be arranged on the first partition wall PW1 and the second partition wall PW2. The first common layer 222a and the second common layer 222c may extend to the opening area OA, and may cover the upper surfaces and the lateral surfaces of the first partition wall PW1 and the second partition wall PW2. The first and second inorganic encapsulation layers 310 and 330 may be arranged on the second common layer 222c on the first partition wall PW1 and the second partition wall PW2.

At least one inorganic contact region ICR may be arranged at (e.g., in or on) the intermediate area MA. In FIG. 11, the inorganic contact region ICR may be provided in a plurality with the first partition wall PW1 and the second partition wall PW2 therebetween. The inorganic contact regions ICR may be arranged between the first partition wall PW1 and the display area DA, between the first partition wall PW1 and the second partition wall PW2, and between the second partition wall PW2 and the opening area OA.

In an embodiment, the first common layer 222a and the second common layer 222c may include the first opening OP1, the second opening OP2, and a third opening OP3 corresponding to the inorganic contact regions ICR, respectively. In an embodiment, the first opening OP1 may be arranged between the first partition wall PW1 and the display area DA. The second opening OP2 may be arranged between the second partition wall PW2 and the opening area OA. The third opening OP3 may be arranged between the first partition wall PW1 and the second partition wall PW2. The inorganic insulating layer IL at (e.g., in or on) the intermediate area MA may be exposed through the first to third openings OP1, OP2, and OP3. As described above, the inorganic insulating layer IL exposed through the first to third openings OP1, OP2, and OP3 contacts the first inorganic encapsulation layer 310, and thus, the first to third openings OP1, OP2, and OP3 may constitute the inorganic contact regions ICR. Because the inorganic contact regions ICR are provided in a plurality, moisture transmission through the opening area OA may be gradually blocked.

FIG. 12 shows the intermediate area MA and a pixel P arranged at (e.g., in or on) the display area DA. A cross-sectional structure of FIG. 12 may correspond to the structure of FIG. 7. In other words, the dummy emission layers 222dm are not provided in the embodiment of FIG. 12. While FIGS. 9 and 11 show that the dummy emission layers 222dm are arranged at (e.g., in or on) the wiring area WLA, which is an edge region of the display area DA, FIG. 12 shows that the dummy emission layers 222dm are not arranged at (e.g., in or on) the wiring area WLA. Accordingly, the emission layer 222b may be provided at only a portion in which a pixel P is formed or substantially formed.

Referring to the intermediate area MA of FIG. 12, the dummy emission layers 222dm are not arranged at (e.g., in or on) the intermediate area MA, for example, the laser irradiation region LIR, like the above embodiments. In the display apparatus according to one or more embodiments, the dummy emission layers 222dm are not arranged at (e.g., in or on) the intermediate area MA, for example, the laser irradiation region LIR, and thus, foreign substance generation in the relevant region may be suppressed or reduced during the laser process.

Figure 13:
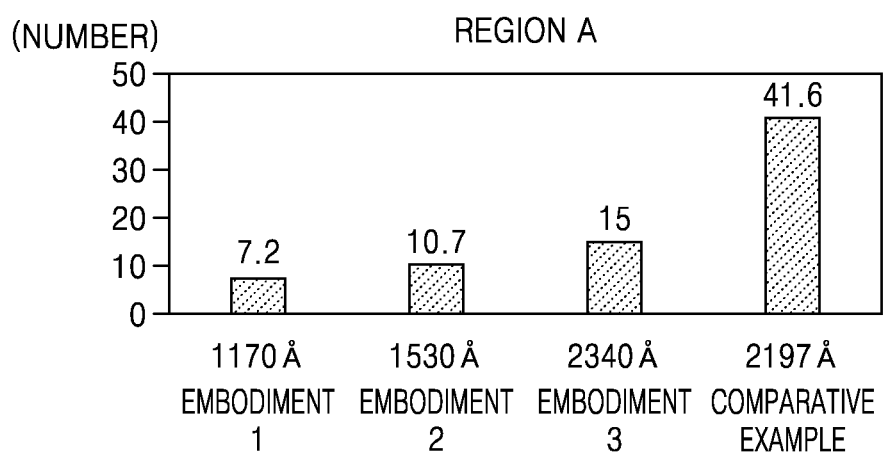
FIG. 13 is a graph showing results of measuring the number of foreign substances after laser processing in a display panel according to an embodiment.
Figure 14:
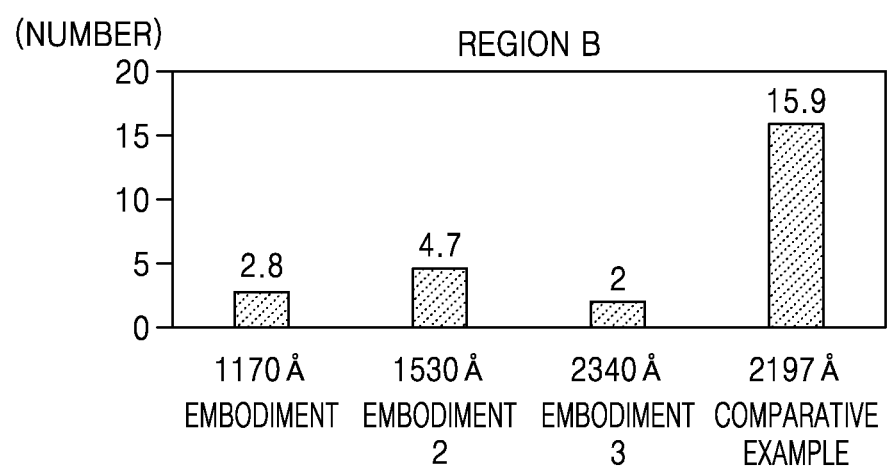
FIG. 14 is a graph showing results of measuring the number of foreign substances after laser processing in a display panel according to an embodiment.

FIGS. 13 and 14 are experimental graphs showing results of measuring the number of foreign substances after a laser process that occur from a display panel according to one or more embodiments.

Hereinafter, the experimental results of FIGS. 13 and 14 are described with reference to the above-described embodiments.

FIG. 13 shows results obtained by measuring the number of foreign substances per unit area in a region A, and FIG. 14 shows results obtained by measuring the number of foreign substances per unit area in a region B. In the experiments of FIGS. 13 and 14, the region A is a region that is adjacent to the opening area OA, and the region B is a region at (e.g., in or on) which the first partition wall PW1 is arranged.

In FIGS. 13 and 14, the experiments have been carried out based on an Embodiment 1, an Embodiment 2, an Embodiment 3, and a Comparative example. Embodiment 1 is a case where the second common layer 222c is not provided and only the first common layer 222a is provided. In this case, the thickness of the first common layer 222a has been set to about 1170 Å. In addition, Embodiment 2 is a case where both the first common layer 222a and the second common layer 222c are provided, and the thicknesses thereof have been set to about 1530 Å. In addition, Embodiment 3 is a case where the second common layer 222c is not provided and only the first common layer 222a is provided, and the thickness of the first common layer 222a has been set to about 2340 Å. Embodiments 1 to 3 are cases where the dummy emission layers 222dm are not arranged at (e.g., in or on) the intermediate area MA, for example, the laser irradiation region LIR. Unlike Embodiments 1 to 3, the Comparative example is a case where the dummy emission layers 222dm are also arranged at (e.g., in or on) the intermediate area MA. In the Comparative example, an average thickness of the first common layer 222a, the dummy emission layer 222dm, and the second common layer 222c has been set to about 2197 Å.

Referring to FIG. 13, the number of foreign substances generated in the region A according to the Comparative example has been measured as 41.6. In contrast, the number of foreign substances generated in the region A according to the Embodiments 1, 2, and 3 have been measured as 7.2, 10.7, and 15, respectively. The number of foreign substances has been measured as an average value through repeated experiments.

Referring to FIG. 14, the number of foreign substances generated in the region B according to the Comparative example has been measured as 15.9. In contrast, the number of foreign substances generated in the region B according to the Embodiments 1, 2, and 3 have been measured as 2.8, 4.7, and 2, respectively. The number of foreign substances has been measured as an average value through repeated experiments.

As described above, in summarizing the experimental results of FIGS. 13 and 14, it is revealed that foreign substances of a remarkably low level is observed in the cases of Embodiments 1 to 3 where the dummy emission layer 222dm is not formed at (e.g., in or on) the intermediate area MA, for example, the laser irradiation region LIR, compared to that of the Comparative example. Accordingly, in the display apparatus according to one or more embodiments, foreign substances that are generated during the laser process in the intermediate area MA are reduced, and thus, the reliability of the display apparatus may be improved.

While the display apparatus has been mainly described, the present disclosure is not limited thereto. As an example, a method of manufacturing the display apparatus also falls within the spirit and scope of the present disclosure.

FIGS. 15A to 15D are cross-sectional views showing some processes of a method of manufacturing a display apparatus according to an embodiment.

The display apparatus according to one or more embodiments may be generally formed in a stacking order in the +z-direction on the substrate 100 as shown in the cross-sectional views of FIGS. 9, 11, and 12. Hereinafter, in FIGS. 15A to 15D, redundant description as those of the above may not be repeated, and characteristics of a manufacturing process are mainly described with reference to the above cross-sectional views.

Figure 15A:
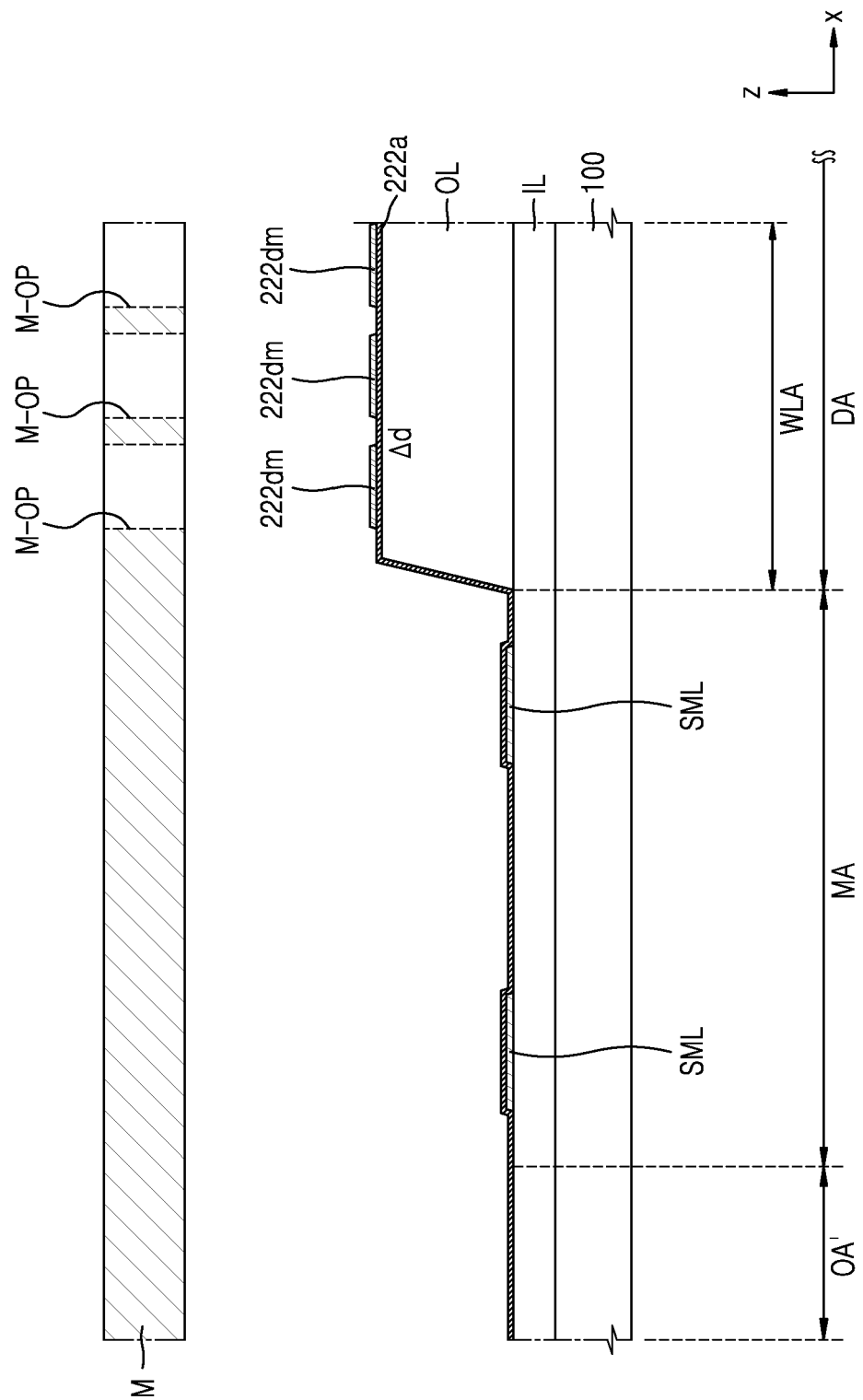
FIGS. 15A-15D are cross-sectional views showing some processes of a method of manufacturing a display apparatus according to an embodiment.

Referring to FIG. 15A, the substrate 100 including the opening area OA, the display area DA surrounding (e.g., around a periphery of) at least a portion of the opening area OA, and the intermediate area MA between the opening area OA and the display area DA may be prepared. In FIG. 15A, the through hole 10H of FIG. 9 and the like is not formed in the opening area OA, and the opening area OA is denoted by a first area OA'.

The inorganic insulating layer IL may be formed on the entire surface of the substrate 100, and an organic insulating layer OL may be formed to correspond to the display area DA. The inorganic insulating layer IL may include at least one of the buffer layer 201, the gate insulating layer 203, the first interlayer insulating layer 205, and the second interlayer insulating layer 207 of FIG. 9 and the like. The organic insulating layer OL may be the first organic insulating layer 209 and/or the second organic insulating layer 211 of FIG. 9 and the like.

A sacrificial metal layer SML may be formed on the inorganic insulating layer IL corresponding to the intermediate area MA. The sacrificial metal layer SML may be provided to remove the first common layer 222a and the second common layer 222c. A region in which the sacrificial metal layer SML is formed may correspond to the inorganic contact region ICR of FIG. 9 and the like in the display apparatus.

Although the partition wall is omitted from the intermediate area MA of FIGS. 15A to 15D for convenience of illustration, the partition wall may be arranged between the sacrificial metal layers SML.

The first common layer 222a may be arranged to cover the sacrificial metal layer SML. The first common layer 222a may be formed on the entire surface of the substrate 100 by using an open mask.

Then, the dummy emission layers 222dm may be formed on the first common layer 222a. The dummy emission layers 222dm may be formed through the same process as a process of forming the emission layer 222b of the display area DA of FIG. 12 and the like. In an embodiment, the dummy emission layer 222dm may be formed to constitute a pattern by a mask having an opening M-OP, for example, a fine metal mask FMM.

In an embodiment, the dummy emission layer 222dm is not formed at (e.g., in or on) the intermediate area MA. In other words, the dummy emission layer 222dm may not be formed at (e.g., in or on) the intermediate area MA and then removed. Accordingly, a mask M for forming the emission layer 222b may not have an opening in a portion corresponding to the intermediate area MA. As shown in FIG. 15A, a portion of the mask M corresponding to the intermediate area MA may have a closed shape without an opening formed therein.

As described above, because the dummy emission layer 222dm is not formed at (e.g., in or on) the intermediate area MA, the generation of foreign substances may be reduced while the opposite electrode 223 and the capping layer 230 are removed during the laser irradiation process shown in FIG. 15C, which is described in more detail below.

Figure 15B:
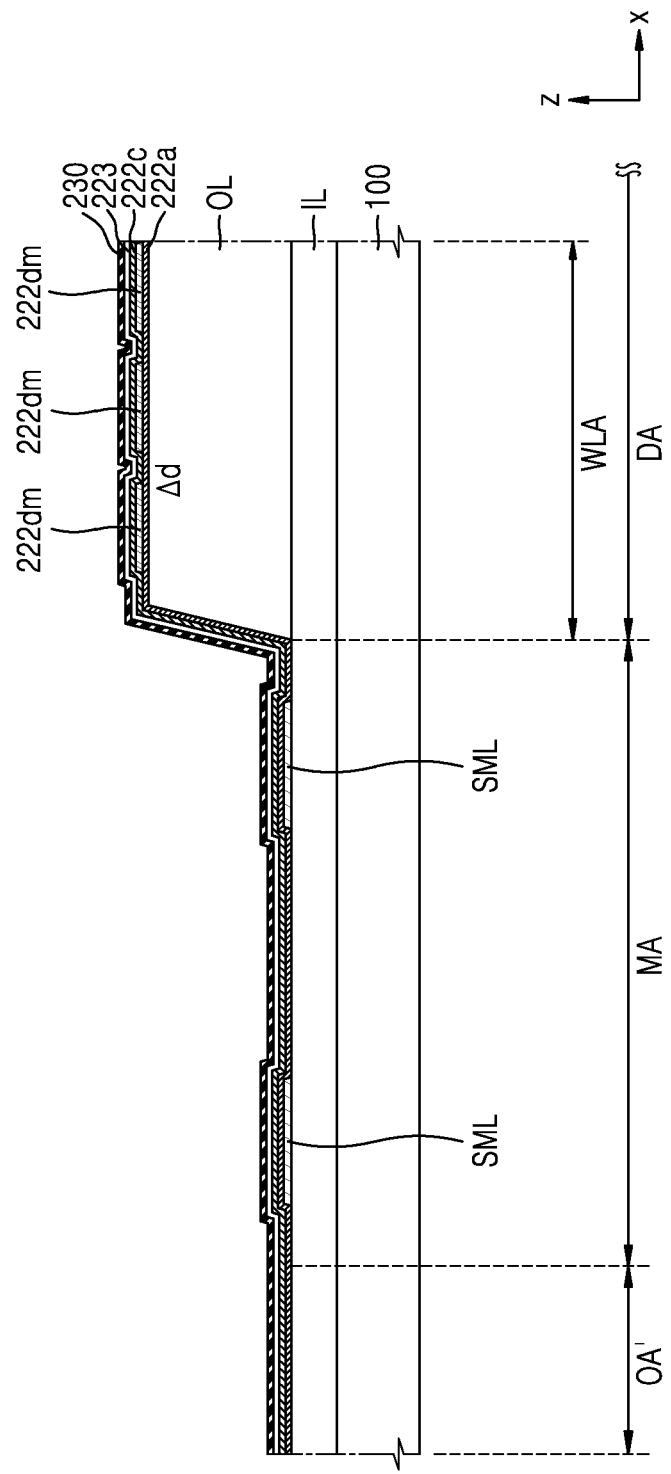

Referring to FIG. 15B, the second common layer 222c, the opposite electrode 223, and the capping layer 230 may be sequentially formed to cover the dummy emission layer 222dm. Like the first common layer 222a, the second common layer 222c, the opposite electrode 223, and the capping layer 230 may be formed on the entire surface of the substrate 100 by using an open mask.

Figure 15C:
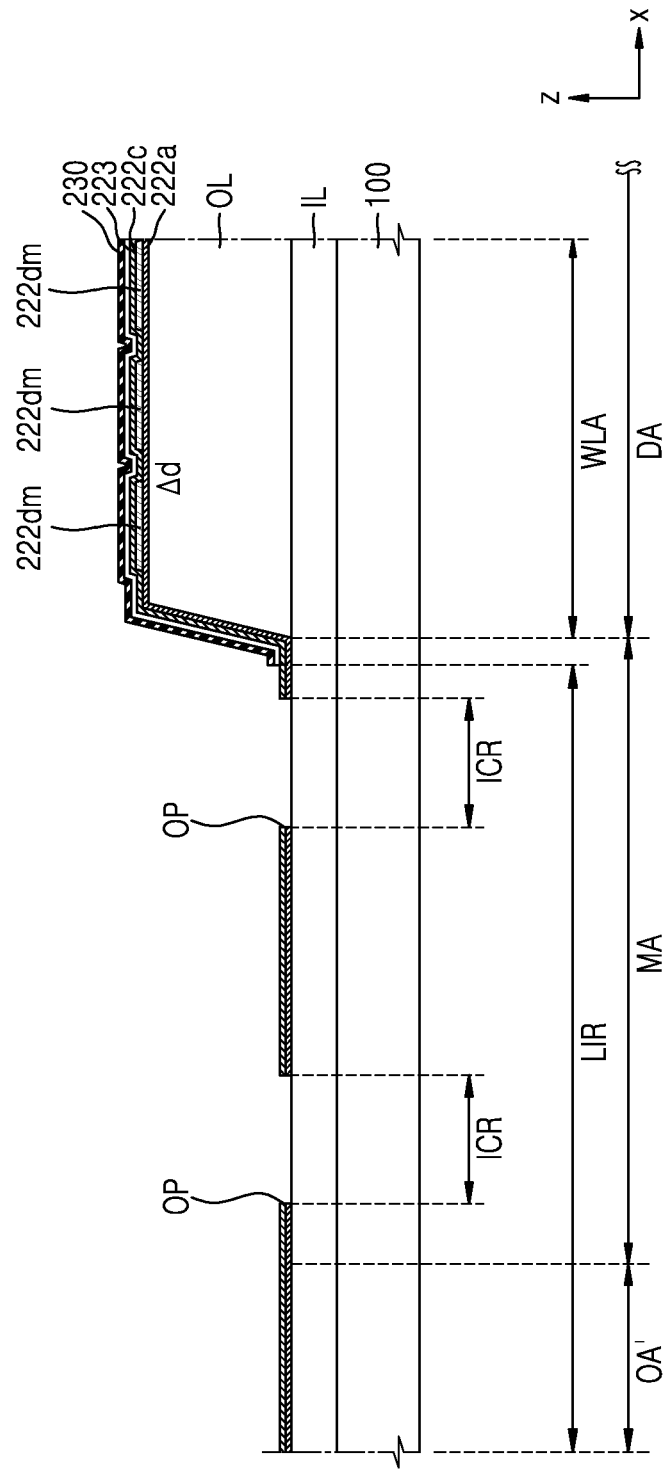

Then, referring to FIG. 15C, a laser L may be irradiated to the substrate 100 corresponding to the laser irradiation region LIR. Accordingly, metal layers such as the opposite electrode 223 and the capping layer 230 arranged at (e.g., in or on) the laser irradiation region LIR may be removed. In an embodiment, the laser L may be an infrared (IR) laser.

The sacrificial metal layer SML is formed as shown in FIG. 15A to remove the first common layer 222a and the second common layer 222c, which are organic material layers, in this laser irradiation process. In other words, the first common layer 222a and the second common layer 222c on the sacrificial layer SML may be concurrently (e.g., simultaneously) removed during a process of removing the sacrificial metal layer SML. As shown in FIG. 15C, the sacrificial layer SML may be removed by the laser L, and a portion of the first common layer 222a and the second common layer 222c corresponding to (e.g., overlapping with) the sacrificial metal layer SML may be concurrently (e.g., simultaneously) removed.

Openings OP may be formed in the first common layer 222a and the second common layer 222c corresponding to the portions of the sacrificial metal layer SML that are removed. The inorganic insulating layer IL may be exposed through the openings OP. These openings OP may disconnect the first common layer 222a and the second common layer 222c, which are the organic material layers. Because the organic material layers are vulnerable to impurities and/or moisture transmission, impurities or moisture may be easily blocked by disconnecting the first common layer 222a and the second common layer 222c through the openings OP, such that the impurities and/or moisture may not be introduced to the display area DA through the organic material layers.

Figure 15D:
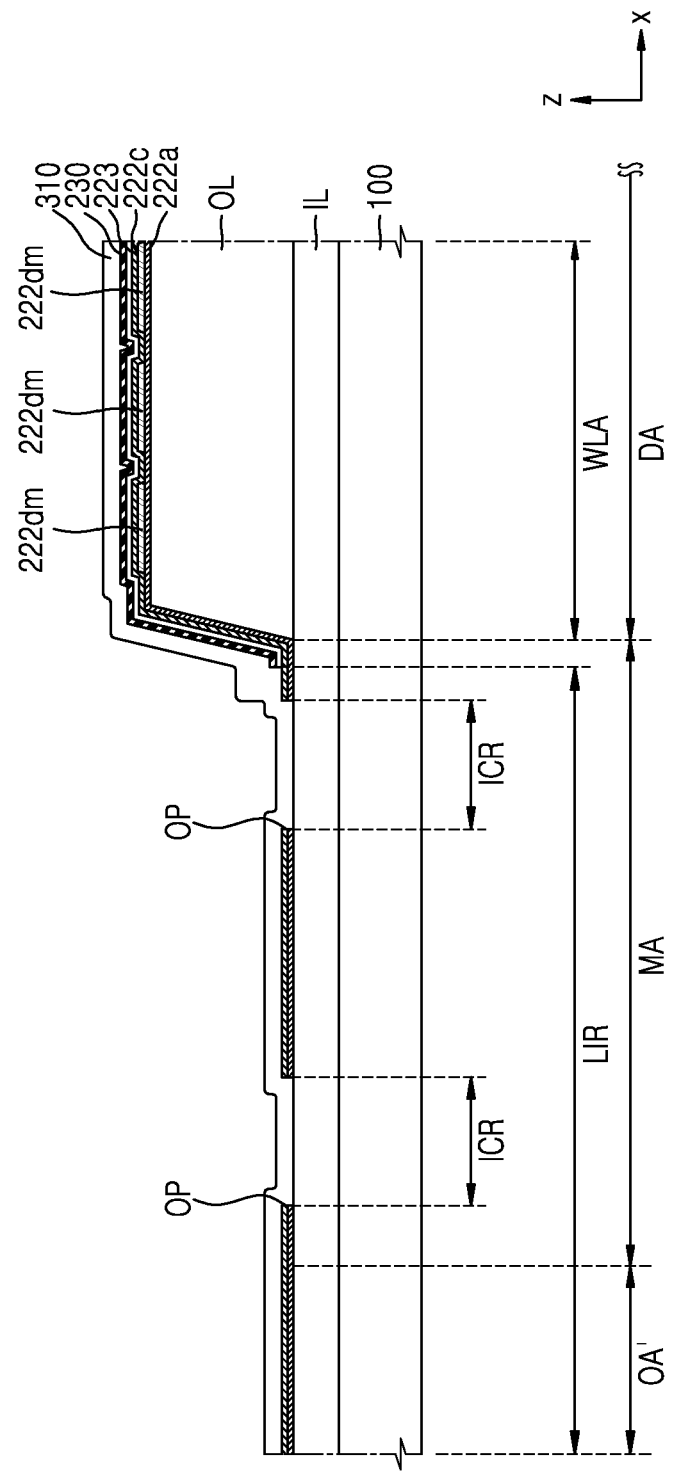

Referring to FIG. 15D, the first inorganic encapsulation layer 310 may be formed on the capping layer 230. The first inorganic encapsulation layer 310 may be formed on the entire surface of the substrate 100. The first inorganic encapsulation layer 310 may contact the inorganic insulating layer IL exposed through the openings OP. Accordingly, the inorganic contact regions ICR may be formed to correspond to the openings OP.

Then, as shown in FIG. 12, the organic encapsulation layer 320 and the second inorganic encapsulation layer 330 are sequentially formed on the first inorganic encapsulation layer 310. Then, the first region OA' of FIG. 15D is laser-cut to form the hole 10H in the opening area OA as shown in FIG. 12 and the like.

According to one or more embodiments, a display apparatus having an improved reliability while having an area in which various kinds of components may be arranged inside a display area, and a manufacturing method thereof may be implemented. However, the spirit and scope of the present disclosure is not limited thereto.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
    a substrate comprising an opening area, a display area surrounding at least a portion of the opening area, and an intermediate area between the opening area and the display area; and
    a display element at the display area, and comprising a pixel electrode, an opposite electrode on the pixel electrode, and an intermediate layer between the pixel electrode and the opposite electrode,
    wherein the intermediate layer comprises a first common layer, a second common layer on the first common layer, and an emission layer between the first common layer and the second common layer,
    wherein the first common layer and the second common layer extend to the intermediate area, and the second common layer is directly on the first common layer at the intermediate area, and
    wherein the first common layer and the second common layer each has an opening at the intermediate area, and in the opening, a first inorganic layer located above the first and second common layers at the display area directly contacts a top surface of a second inorganic layer located under the first and second common layers at the display area, the top surface of the second inorganic layer being exposed by the opening.

2. The display apparatus of claim 1, further comprising:
    a thin-film encapsulation layer on the display element, and comprising at least one inorganic encapsulation layer as the first inorganic layer and at least one organic encapsulation layer; and
    an inorganic insulating layer as the second inorganic layer at the display area and the intermediate area, and located between the substrate and a first partition wall, wherein the inorganic insulating layer contacts the inorganic encapsulation layer through the opening.

3. The display apparatus of claim 1, further comprising:
a first partition wall at the intermediate area, and surrounding the opening area,
wherein the opening comprises a first opening between the first partition wall and the display area.

4. The display apparatus of claim 3, wherein the opening further comprises a second opening between the first partition wall and the opening area.

5. The display apparatus of claim 3, further comprising: a second partition wall spaced from the first partition wall,
wherein the opening further comprises a third opening between the first partition wall and the second partition wall.

6. The display apparatus of claim 1, further comprising:
a thin-film transistor at the display area; and
an organic insulating layer on the thin-film transistor,
wherein the opposite electrode covers a lateral end portion of the organic insulating layer.

7. The display apparatus of claim 1, wherein the intermediate area comprises a laser irradiation region, and
wherein the opposite electrode is not located at the laser irradiation region.

8. The display apparatus of claim 7, further comprising:
a capping layer on the opposite electrode,
wherein the capping layer is not located at the laser irradiation region.

9. A display apparatus comprising:
a substrate comprising an opening area, a display area surrounding at least a portion of the opening area, and an intermediate area between the opening area and the display area; and
a display element at the display area, and comprising a pixel electrode, an opposite electrode on the pixel electrode, and an intermediate layer between the pixel electrode and the opposite electrode,
wherein the intermediate layer comprises a first common layer, a second common layer on the first common layer, and an emission layer between the first common layer and the second common layer,
wherein the first common layer and the second common layer extend to the intermediate area, and the second common layer is directly on the first common layer at the intermediate area, and
wherein the display apparatus further comprises:
a wiring portion at a region of the display area that is adjacent to the intermediate area, the wiring portion bypassing the opening area; and
a dummy emission layer on the wiring portion.

10. The display apparatus of claim 1, wherein a thickness of the first common layer is greater than a thickness of the second common layer.

11. The display apparatus of claim 9, wherein the dummy emission layer comprises a same material as that of the emission layer.

12. The display apparatus of claim 9, wherein the dummy emission layer is between the first common layer and the second common layer.

13. The display apparatus of claim 12, wherein the dummy emission layer comprises the same material as that of the emission layer.

14. A display apparatus comprising:
a substrate comprising an opening area, a display area surrounding at least a portion of the opening area, and an intermediate area between the opening area and the display area;
a pixel electrode at the display area;
an emission layer at the display area;
an opposite electrode on the emission layer, and located at the display area and the intermediate area;
a common organic material layer between the pixel electrode and the opposite electrode, and located at the display area and the intermediate area; and
an inorganic encapsulation layer on the opposite electrode, and located at the display area and the intermediate area,
wherein the common organic material layer has an opening surrounding the opening area at the intermediate area, and the inorganic encapsulation layer directly contacts a top surface of an inorganic layer located underneath the common organic material layer at the display area, the top surface of the inorganic layer being exposed through the opening.

* * * * *